United States Patent
Zenou

(10) Patent No.: US 10,799,984 B2
(45) Date of Patent: Oct. 13, 2020

(54) METAL DROPLET JETTING SYSTEM

(71) Applicant: Granat Research, Ltd., Jerusalem (IL)

(72) Inventor: Michael Zenou, Hashmonaim (IL)

(73) Assignee: Granat Research, Ltd., Jerusalem (IL)

( * ) Notice: Subject to any disclaimer, the term of this patent is extended or adjusted under 35 U.S.C. 154(b) by 154 days.

(21) Appl. No.: 16/185,458

(22) Filed: Nov. 9, 2018

(65) Prior Publication Data

US 2019/0143449 A1    May 16, 2019

Related U.S. Application Data

(60) Provisional application No. 62/586,311, filed on Nov. 15, 2017.

(51) Int. Cl.
*B23K 26/14* (2014.01)
*B23K 26/342* (2014.01)
(Continued)

(52) U.S. Cl.
CPC .......... *B23K 26/147* (2013.01); *B22F 3/1055* (2013.01); *B23K 26/0622* (2015.10);
(Continued)

(58) Field of Classification Search
CPC .............. B23K 26/147; B23K 26/0676; B23K 26/0736; B23K 26/1476; B23K 26/342;
(Continued)

(56) References Cited

U.S. PATENT DOCUMENTS 5,021,808 A    6/1991   Kohyama
6,656,270 B2 * 12/2003  Chung .................... C30B 13/00
                                                      117/4
(Continued)

FOREIGN PATENT DOCUMENTS

EP    3219474 A1    9/2017
GB    2218660 A  * 11/1989  ......... B23K 26/0622
(Continued)

OTHER PUBLICATIONS

International Search Report and Written Opinion dated Feb. 15, 2019, from the ISA/European Patent Office, for International Patent Application No. PCT/IB2018/058845 (filed Nov. 9, 2018), 16 pages.
(Continued)

*Primary Examiner* — Geoffrey S Evans
(74) *Attorney, Agent, or Firm* — Ascenda Law Group, PC

(57) ABSTRACT

Systems and methods for additive manufacturing, and, in particular, such methods and apparatus as employ pulsed lasers or other heating arrangements to create metal droplets from donor metal micro wires, which droplets, when solidified in the aggregate, form 3D structures. A supply of metal micro wire is arranged so as to be fed towards a nozzle area by a piezo translator. Near the nozzle, an end portion of the metal micro wire is heated (e.g., by a laser pulse or an electric heater element), thereby causing the end portion of the metal micro wire near the nozzle area to form a droplet of metal. A receiving substrate is positioned to receive the droplet of metal jetted from the nozzle area.

15 Claims, 27 Drawing Sheets

(51) Int. Cl.
  *B23K 26/146* (2014.01)
  *B23K 26/082* (2014.01)
  *C23C 14/28* (2006.01)
  *C23C 14/04* (2006.01)
  *B23K 26/067* (2006.01)
  *B41J 2/04* (2006.01)
  *B23K 26/073* (2006.01)
  *C23C 14/24* (2006.01)
  *B41J 2/14* (2006.01)
  *B22F 3/105* (2006.01)
  *B23K 26/0622* (2014.01)
  *B33Y 40/00* (2020.01)
  *B33Y 10/00* (2015.01)
  *B33Y 30/00* (2015.01)

(52) U.S. Cl.
  CPC ...... *B23K 26/0676* (2013.01); *B23K 26/0736* (2013.01); *B23K 26/082* (2015.10); *B23K 26/14* (2013.01); *B23K 26/146* (2015.10); *B23K 26/1476* (2013.01); *B23K 26/342* (2015.10); *B41J 2/04* (2013.01); *B41J 2/14104* (2013.01); *C23C 14/048* (2013.01); *C23C 14/246* (2013.01); *C23C 14/28* (2013.01); *B22F 2003/1056* (2013.01); *B33Y 10/00* (2014.12); *B33Y 30/00* (2014.12); *B33Y 40/00* (2014.12); *B41J 2202/04* (2013.01)

(58) Field of Classification Search
  CPC ............ B23K 26/0622; B23K 26/0626; C23C 14/28; C23C 14/048; C23C 14/246; B41J 2/04; B41J 2/14104
  See application file for complete search history.

(56) References Cited

U.S. PATENT DOCUMENTS

2004/0033702 A1\* 2/2004 Tamanyan ............... C23C 14/28
  438/789
2016/0318130 A1\* 11/2016 Stempfer ........... G05B 19/4099
2017/0158543 A1 6/2017 Metz et al.
2017/0266728 A1 9/2017 Johnson et al.
2017/0365484 A1\* 12/2017 Kotler ...................... C25F 3/14

FOREIGN PATENT DOCUMENTS

| | | | | |
|---|---|---|---|---|
| JP | 03177556 | A | \* | 8/1991 |
| JP | 07100679 | A | \* | 4/1995 |
| KR | 20030041643 | A | | 5/2003 |
| WO | 9414616 | A1 | | 7/1994 |

OTHER PUBLICATIONS

International Preliminary Report on Patentability dated Feb. 10, 2020, from the IPEA/European Patent Office, for International Patent Application No. PCT/IB2018/058845 (filed Nov. 9, 2018), 7 pages.

Zenou; et al., "Laser jetting of femto-liter metal droplets for high resolution 3D printed structures", Scientific Reports (Nov. 25, 2015), 5:17265, 10 pages.

\* cited by examiner

METAL DROPLET JETTING SYSTEM

RELATED APPLICATIONS

This is a NONPROVISIONAL of, claims priority to, and incorporates by reference U.S. Provisional Application No. 62/586,311, filed 15 Nov. 2017.

FIELD OF THE INVENTION

The present invention relates generally to methods and apparatus for additive manufacturing, and, in particular, to such methods and apparatus as employ pulsed lasers or other heating arrangements to create metal droplets from donor micro wires, which droplets, when solidified in the aggregate, form three-dimensional ("3D") structures.

BACKGROUND

So-called "3D printing" or, more generally, additive manufacturing, is a broad term used to describe processes to fabricate three-dimensional objects from digital data files under computer control. A number of different additive manufacturing techniques have been developed, some of which involve the fusing of material, typically a metal, polymer, or ceramic powder, using a laser. A more recent additive manufacturing process known as laser-induced forward transfer ("LIFT"), illustrated in FIG. 1, creates and ejects metal droplets from a thin metal foil or film disposed on a back side (from the standpoint of the incident laser beam) of transparent substrate. To form the droplets, a laser is focused on a small area of the metal foil through the transparent substrate on which it is carried. Local heating caused by the laser causes a droplet of the metal foil to be jetted, where the size of the droplet is proportional to the cross-section of the laser beam incident on the foil. The droplet so ejected travels across a gap (typically on the order of a few microns) and coalesces on a recipient substrate. See, e.g., Zenou, M. et al., "Laser jetting of femto-liter metal droplets for high resolution 3D printed structures," Scientific Reports 5, 17265; doi: 10.1038 (2015). This technique is applied to printing of 3D structures by jetting overlapped metal droplets in shapes defined by cross-sections of the object being printed.

SUMMARY OF THE INVENTION

Described herein are systems and methods for additive manufacturing, and, in particular, such methods and apparatus as employ pulsed lasers or other heating arrangements to create metal droplets from donor micro wires, which droplets, when solidified in the aggregate, form 3D structures.

In one embodiment, a system for metal laser jetting includes a supply of metal micro wire (e.g., having a diameter of approximately 10 microns) arranged so as to be fed towards a nozzle area by a piezo translator and/or motorized translator. The metal micro wire is supported along its length in a through hole of a glass substrate (e.g., fused quartz, fused silica, or ceramic glass), and the nozzle area is located at an exit of the through hole. A laser is positioned to emit, under the control of a controller, a light pulse (e.g., IR, UV, or visible light, with the glass substrate being transparent, or nearly so, at a wavelength of the laser light pulse) towards the nozzle area where the end of the metal micro wire is positioned by the piezo translator, thereby causing an end portion of the metal micro wire near the nozzle area to be heated. A receiving substrate is positioned to receive a droplet of metal jetted from the nozzle area. A heater may be affixed to one or more sides of the glass substrate to preheat the metal micro wire.

Preferably, the supply of metal micro wire is organized in a spool which is carried on a reel. In some instances, the supply of metal micro wire is organized in multiple spools of metal micro wires, each associated with its own respective piezo translator (and/or motorized translator) and supporting glass substrate arrangement. Alternatively, the supply of metal micro wire may be organized in multiple spools of metal micro wires and a single glass substrate shared by some or all of the spools of metal micro wires. In any or all of these instances, the supply of metal micro wire may be arranged so as to be fed towards the nozzle area by the piezo translator via one or more rollers.

The piezo translator may include one or more piezo ceramics arranged to move the metal micro wire in a defined direction upon application of an electric current under the control of the controller. In some cases, the piezo translator may include one or more longitudinal piezo actuators, one or more piezoelectric shear actuators, or one or more tube actuators. Additional piezo translators may be arranged to rotate a reel on which a spool of the metal micro wire is carried about a central axis, thereby playing out the metal micro wire towards the nozzle area, under the control of the controller.

In some embodiments, the laser is included in a scanning laser arrangement configured to scan, under the control of the controller, a single laser beam over a scanning path so that the laser beam, when activated, is incident upon one of a plurality of nozzle areas associated with a respective one of the metal micro wires. Such a scanning laser arrangement may include a scanning mirror or an acousto-optic deflector.

As described further below, the glass substrate may be associated with a form shaped to change an orientation of the metal micro wire from a first plane to a second plane as the metal micro wire is fed towards the nozzle area. Also, the glass substrate may define a reaction area in which the metal micro wire is exposed to the light pulse. For example, the nozzle area may make up a portion of such a reaction area and a second piezo translator may be positioned adjacent the nozzle area. Such a reaction area may include a gas inlet to allow for the introduction of a pressurized gas.

In further embodiments of the invention, a 3D article is manufactured by fusion of metal droplets in forms defined by cross-sections of the article under construction. Such a method may include distributing successive layers of metal droplets over a receiving medium and previously deposited layers of metal droplets by depositing the droplets while moving the receiving medium relative to a nozzle area of a metal laser jetting system in which a supply of metal micro wire is fed towards the nozzle area at which an end portion of the metal micro wire is heated by a laser pulse emitted from a laser under the control of a controller and incident towards the nozzle area, thereby causing the end portion of the metal micro wire near the nozzle area to form the droplets. Moving the receiving medium relative to the nozzle area between successive ones of the droplets thus forms layers of metal on the receiving medium and, successively, on previously jetted layers.

In such a method, the controller may cause the laser to emit pulses, thereby creating the metal droplets, at times corresponding to necessary applications of metal for forming the cross-sections of the article under construction according to provided images of the cross-sections and ensuring that the metal droplets are jetted when a portion of the receiving medium is positioned below the nozzle area at a point for which solid material is needed. Also, after each droplet is jetted, the controller may cause a piezo translator (and/or motorized translator) to advance a quantity of the metal micro wire into the nozzle area in preparation for a next laser pulse. At or about the same time as causing the piezo translator to advance the quantity of the metal micro wire into the nozzle area, the controller may further cause the receiving medium to be displaced relative to the nozzle area to a next position at which a metal droplet is to be jetted.

In some embodiments, the article under construction is imaged during its construction using an imaging device. Images of the deposited layers of metal droplets may thus be analyzed as they are being formed, and the laser pulses incident on the metal micro wire controlled in accordance such an evaluation. Alternatively, or in addition, such imaging of the article under construction during its construction may be used as a basis for modifying an image of a cross-sectional layer of the article under construction so that one or more areas of the image are adjusted from those associated with an original version of said image.

As indicated above, the supply of metal micro wire may be organized in multiple spools of metal micro wires and, accordingly, the laser may be scanned (e.g., using a mirror, an acousto-optic deflector, etc.) over a scanning path so that the laser pulse, when activated, is incident upon one of a plurality of nozzle areas associated with a respective one of the metal micro wires.

Still further embodiments of the invention provide a system for metal laser jetting that includes a supply of metal micro wire arranged so as to be fed towards a reaction area having an associated nozzle area by a piezo translator, the metal micro wire being supported along its length in a through hole of a form, the nozzle area being located near an exit of the through hole; and a heater positioned to contact an end of the metal micro wire adjacent the nozzle area, thereby causing an end portion of the metal micro wire near the nozzle area to be heated. In such systems, the form may be shaped to change an orientation of the metal micro wire from a first plane to a second plane as the metal micro wire is fed towards the nozzle area. In some embodiments of such a system, a second piezo translator (and/or motorized translator) may be positioned adjacent the nozzle area, and the heater being positioned so as to be displaceable towards the end of the metal micro wire by the second piezo translator.

Still further embodiments of the invention provide a method of forming a 3D article by fusion of metal droplets is which successive layers of metal droplets are deposited over a receiving medium (and previously deposited layers of metal droplets) by depositing the droplets while moving the receiving medium relative to a nozzle area of a metal laser jetting system in which system a supply of metal micro wire is fed towards the nozzle area at which an end portion of the metal micro wire is heated by a heater, thereby causing the end portion of the metal micro wire near the nozzle area to form the droplets, said moving occurring between successive ones of the droplets to form layers of metal on the receiving medium and, successively, on previously jetted layers. As the metal micro wire is fed towards the nozzle area the metal micro wire may pass through a through hole in a form. The reaction area is disposed within the form such that a portion of the metal micro wire is exposed within the reaction area when exiting the through hole. Prior to heating of the metal micro wire, the reaction area may be filled with a gas introduced through a gas inlet.

The heater may be operated under control of a controller and affixed to an end of a piezo translator. The piezo translator may thus be operated so as to cause the heater to abut an exposed end of the micro metal wire near the nozzle area, thereby heating the end of the metal micro wire near the nozzle area and forming a metal droplet.

These and further embodiments of the invention are discussed in greater detail below.

BRIEF DESCRIPTION OF THE DRAWINGS

The present invention is illustrated by way of example, and not limitation, in the figures of the accompanying drawings, in which.

DESCRIPTION

The present invention concerns an additive manufacturing technique in which one or more pulsed lasers or other heating arrangements create metal droplets from donor micro wires, which droplets, when solidified in the aggregate, form 3D structures on a receiving substrate. In the LIFT technique discussed above, a metal is thermally evaporated or sputtered onto a plastic foil to provide a metal layer of approximately 1 µm thickness. The use of donor micro wires as in the present invention, and not metalized foils (e.g., thin metal layers deposited on a transparent substrate), offers improvements over the LIFT technique discussed above. For example, by using metal micro wires, less waste is produced inasmuch as the micro wire can be formed into droplets serially along its length, as needed, without wasting material as may be the case with metal foils. Further, metal micro wires may be fashioned relatively easily and inexpensively through conventional extrusion processes. This may assist in reducing the overall cost of systems for metal laser jetting.

Figure 1:
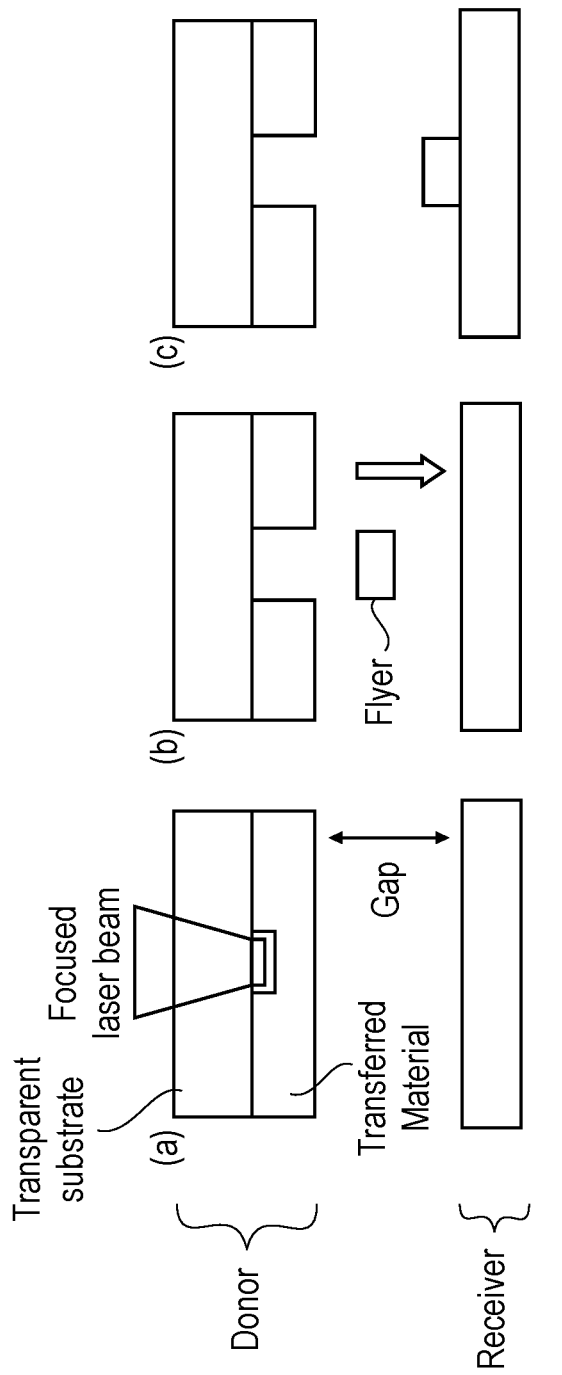
FIG. 1 illustrates aspects of the LIFT additive manufacturing process.
Figure 2:
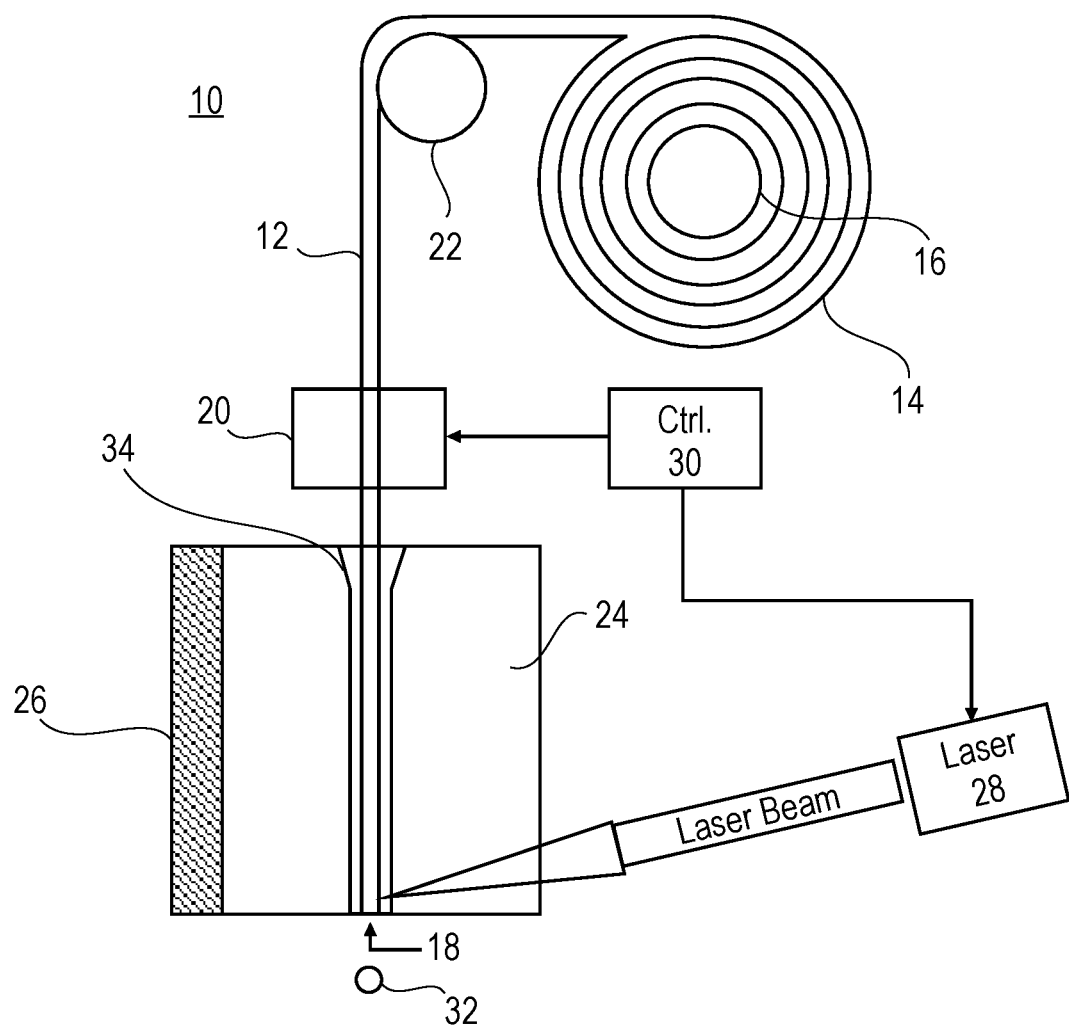
FIG. 2 illustrates one example of a system for metal laser jetting in accordance with one embodiment of the invention.

Referring now to FIG. 2, a first example of a system 10 for metal laser jetting in accordance with one embodiment of the invention is illustrated. In this example, a metal micro wire is organized in a spool 14 which is carried on a reel 16, and is fed towards a nozzle area 18 by a piezo translator (and/or motorized translator) 20 via one or more rollers 22. The metal micro wire 12 is supported along its length in a through hole 34 (which may have a tapered entrance) of a transparent, high temperature resistant (or tolerant) glass substrate 24 to ensure the wire does no bend or break. Examples of materials which may be used for glass substrate 26 include fused quartz, fused silica, and ceramic glass. The nozzle area 18 is located at the exit of through hole 34. A heater 26 may be affixed to one or more sides of the glass substrate 24 to preheat the metal micro wire, though in other embodiments the heater may be omitted. A laser 28 emits, under the control of a controller 30, a pulse, preferably in the IR wavelengths, e.g., at or about 1 µm-10 µm, (but which could be in UV or visible wavelengths) towards the nozzle area 18, where the end of the metal micro wire is positioned by piezo translator 20. The glass substrate 24 is transparent (or nearly so) at the wavelength of the laser light, so that the energy imparted by the laser light is primarily absorbed by the metal micro wire, causing the end portion of the metal micro wire, which has a diameter on the order of 10 microns, near the nozzle area to be heated very rapidly. Local heating of the metal micro wire caused by the laser beam causes a droplet of metal to be jetted from the nozzle area 18. Although not shown in FIG. 1, the nozzle area 18 may be in close proximity to a receiving substrate on which the droplet 32 is deposited. Jetting overlapped metal droplets in this fashion in shapes defined by cross-sections of the object being manufactured results in the formation of the object.

Although not shown in detail in FIG. 1, the piezo translator 20 includes a piezo ceramic that expands in a defined direction upon application of an electric current (e.g., under the control of controller 30). The ceramic is orientated to abut the micro wire 12 so that when the ceramic expands (at the application of a current under the control of controller 30), the micro wire is moved along a single axis (e.g., parallel to its longest dimension), along the direction of the expansion of the crystal, e.g., by friction. Generally, a number of piezo translators will be used to move the micro wire and the various piezo translators may be energized at the same time (or nearly so) so that their actions are coordinated with one another. Thus, the piezo translators are arranged so that they impart longitudinal motion to the micro wire in the same direction and the translation distance may be proportional to the magnitude of the current applied to the piezo translators. In some embodiments, the translation distance of the micro wire for each activation of the piezo translators is on the order of a tens of nanometers to a few microns. Preferably, the reel 16 on which the spool 14 of micro wire is maintained is mounted on an axial pin or other element (not shown) with frictionless, or nearly so, bearings so as to provide minimal resistance when the micro wire is translated by the piezo translators.

The piezo translator(s) employed in embodiments of the present invention may be any of: longitudinal piezo actuators, in which an electric field in the ceramic is applied parallel to the direction of its polarization; piezoelectric shear actuators, in which the electric field in the ceramic is applied orthogonally to the direction of its polarization; or tube actuators, which am radially polarized and have electrodes are applied to an outer surfaces of the ceramic so that the field parallel to its polarization also runs in a radial direction. In other embodiments, one or more piezo translators may be arranged to rotate the reel 16 on which the spool 14 of metal micro wire is carried about its central axis, playing out the metal micro wire 12 towards the nozzle area 18. Such an arrangement may be well suited for instances where the distance between the point at which the metal micro wire is taken off the spool 14 and the nozzle are 18 is relatively short and/or where the metal micro wire is supported along the majority of its length so that it does not bend between these points. Such an arrangement may be used in combination with the linear translator 20 described above, with the multiple piezo translators arranged to actuate at the same time under the control of controller 30.

In one embodiment, controller 30 includes a processor that executes computer-readable instructions (i.e., computer programs or routines) defining methods as described herein, which methods are instantiated and run on non-transitory computer-readable media. Such processes may be rendered in any computer language and executed on any suitable programmable logic hardware. Processor-based controllers 30 upon or with which the methods of the present invention may be practiced will typically include a bus or other communication mechanism for communicating information; a main memory, such as a RAM or other dynamic storage device, coupled to the bus for storing information and instructions to be executed by the processor and for storing temporary variables or other intermediate information during execution of instructions to be executed by the processor; and a ROM or other static storage device coupled to the bus for storing static information and instructions for the processor. A storage device, such as a hard disk or solid-state drive, may also be included and coupled to the bus for storing information and instructions. The subject controller may, in some instances, include a display coupled to the bus for displaying information to a user. In such instances, an input device, including alphanumeric and/or other keys, may also coupled to the bus for communicating information and command selections to the processor. Other types of user input devices, such as cursor control devices may also be included and coupled to the bus for communicating direction information and command selections to the processor and for controlling cursor movement on the display.

The controller 30 may also include a communication interface coupled to the processor, which provides for two-way, wired and/or wireless data communication to/from the controller, for example, via a local area network (LAN). The communication interface sends and receives electrical, electromagnetic, or optical signals which carry digital data streams representing various types of information. For example, the controller 30 may be networked with a remote unit (not shown) to provide data communication to a host computer or other equipment operated by a user The controller can thus exchange messages and data with the remote unit, including diagnostic information to assist in troubleshooting errors, if needed.

In operation, system 10 may be used for forming a 3D article by fusion of metal droplets 32 in forms defined by cross-sections of the object under construction. For example, a first layer of individual droplets may be distributed over a receiving medium (not shown). This may be accomplished by depositing the droplets while moving the receiving medium with respect to the nozzle area between successive droplets to form the relatively thin, approximately uniform layers of metal on the receiving medium and, successively, on previously jetted layers. Once jetted, the droplets cool and solidify in place.

Controller 30 is programmed to cause the laser 28 to emit pulses, thereby creating droplets 32, at times corresponding to the necessary application of metal for forming the cross-section of the article under fabrication. This may be done, for example, by providing images of cross-sections, and ensuring that the metal droplets are jetted when a portion of the receiving medium is positioned below the nozzle area 18 at a point for which solid material is needed. After each droplet is jetted, controller 30 causes piezo translator 20 to advance a quantity of metal wire 12 into the now vacant nozzle area, in preparation for the next application of the laser pulse. At or about the same time, the controller 30 may cause the receiving medium to be displaced relative to the nozzle area 18 to a next position at which a metal droplet is to be jetted. The fusion of metal droplets in locations on the receiving medium corresponding to the image of the cross-sectional layer of the object to be fabricated form an integral layer of metal having a shape corresponding to that image. In addition, supporting structures may be fabricated during production of the object and later removed. Successive layers of metal droplets are jetted on top of one another to complete the object.

During the fabrication process, images of the object under fabrication may be taken (successively or continuously) e.g., using infra-red imaging devices and/or charge coupled device (CCD) cameras. By evaluating images of the metal layers as they are being formed, the laser light incident on the metal wire may be controlled in accordance therewith. For example, an image of a cross-sectional layer of the 3D article used to produce the article under fabrication may be modified according to feedback provided by one or more imaging devices so that one or more areas of the image are adjusted from those associated with an original version of image. Such feedback may be used to compensate for inadequate metal deposition in one or more areas and/or variations in metal droplet displacement prior to cooling sufficiently to fuse with a portion of an existing structure.

Figure 3:
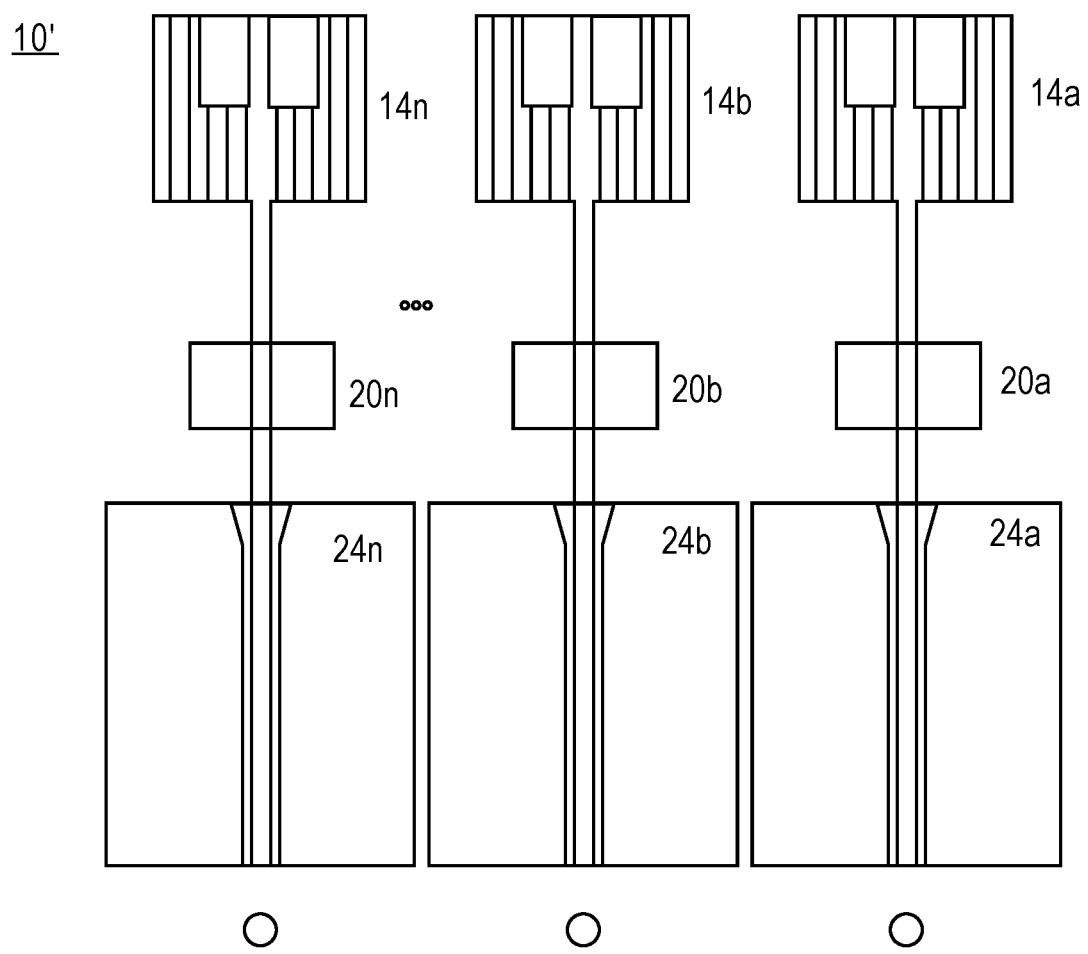
FIG. 3 illustrates another example of a system configured in accordance with various embodiments of the invention, which include multiple spools of metal micro wires, each associated with its own piezo translator and supporting glass substrate arrangement.

FIG. 3 illustrates an example of a system 10' configured in accordance with some embodiments of the invention, and which includes multiple spools 14a-14n of metal micro wires, each associated with its own piezo translator (and/or motorized translator) 20a-20n and supporting glass substrate arrangement 24a-24n. In some instances, a single glass substrate 24 shared by some or all of metal wire spools 14 may be used. Although the figure shows only 3 wire spools, each on different reels, and each potentially a different material, disposed in separate, adjacent jetting arrangements, for ejecting droplets of different kinds of metals, it should be appreciated that systems with any number of reels and kinds of metal wires may be used. Further, although not shown in detail, one should recognize that systems such as 10' may be configured with one or more lasers, for example dedicated lasers for each metal wire spool or fewer lasers shared between various ones of the metal wire spools. Also, components of system 10 may be under the common control of a single controller such as that shown in FIG. 2, or multiple such controllers, configured to act in concert with one another either through appropriate programming, networked communications (with one another and/or a remote unit), or both. Systems such as 10' are useful for jetting arrangements in which different materials are used, and/or where the presence of multiple where spools speeds fabrication of a single object.

Figure 4:
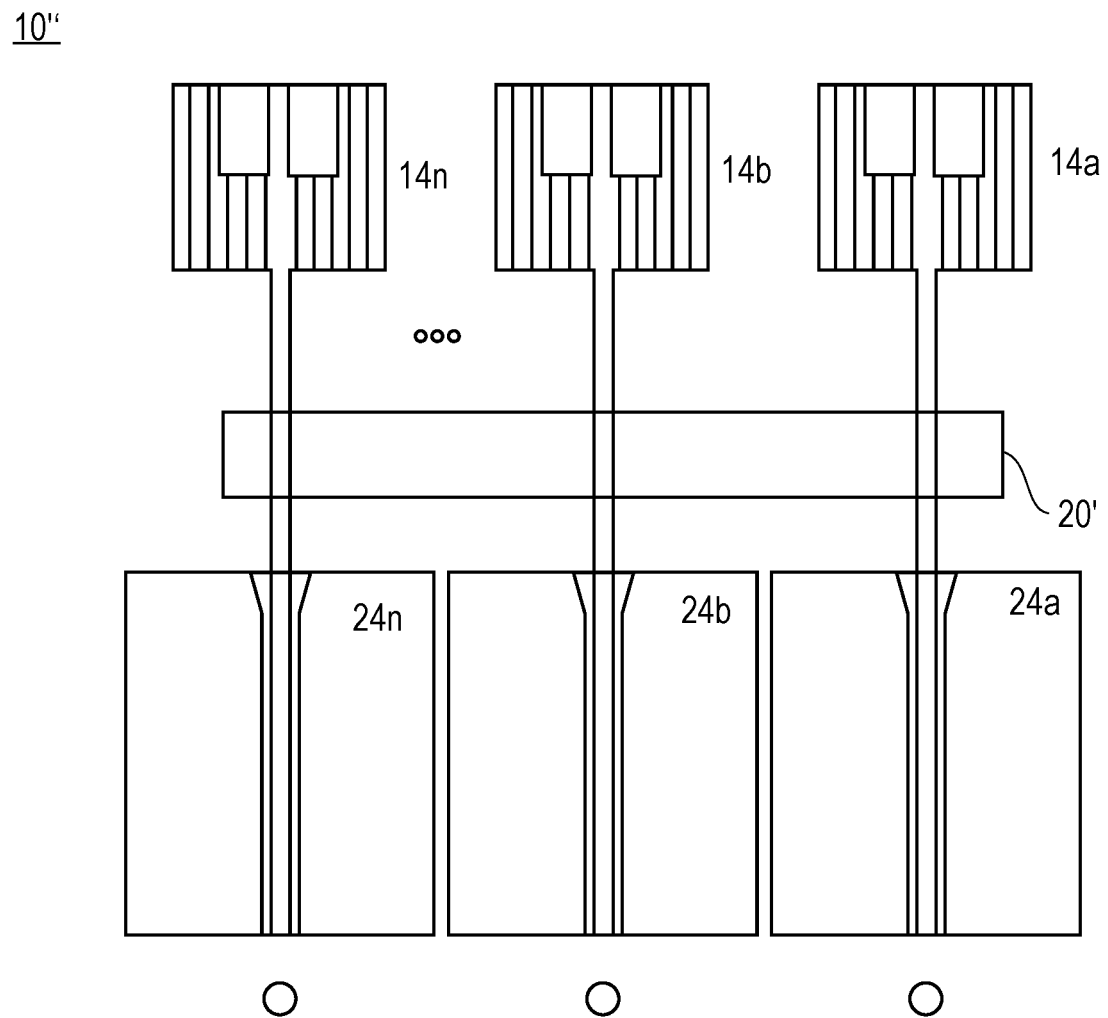
FIG. 4 shows a further example of a system in accordance with various embodiments of the invention in which multiple spools of metal micro wires share a single, common piezo translator.

FIG. 4 shows a further example of a system 10" in which multiple spools 14a-14n of metal micro wires share a single, common piezo translator 20'. Other components of this arrangement are as discussed above with respect to FIGS. 2 and 3.

Figure 5:
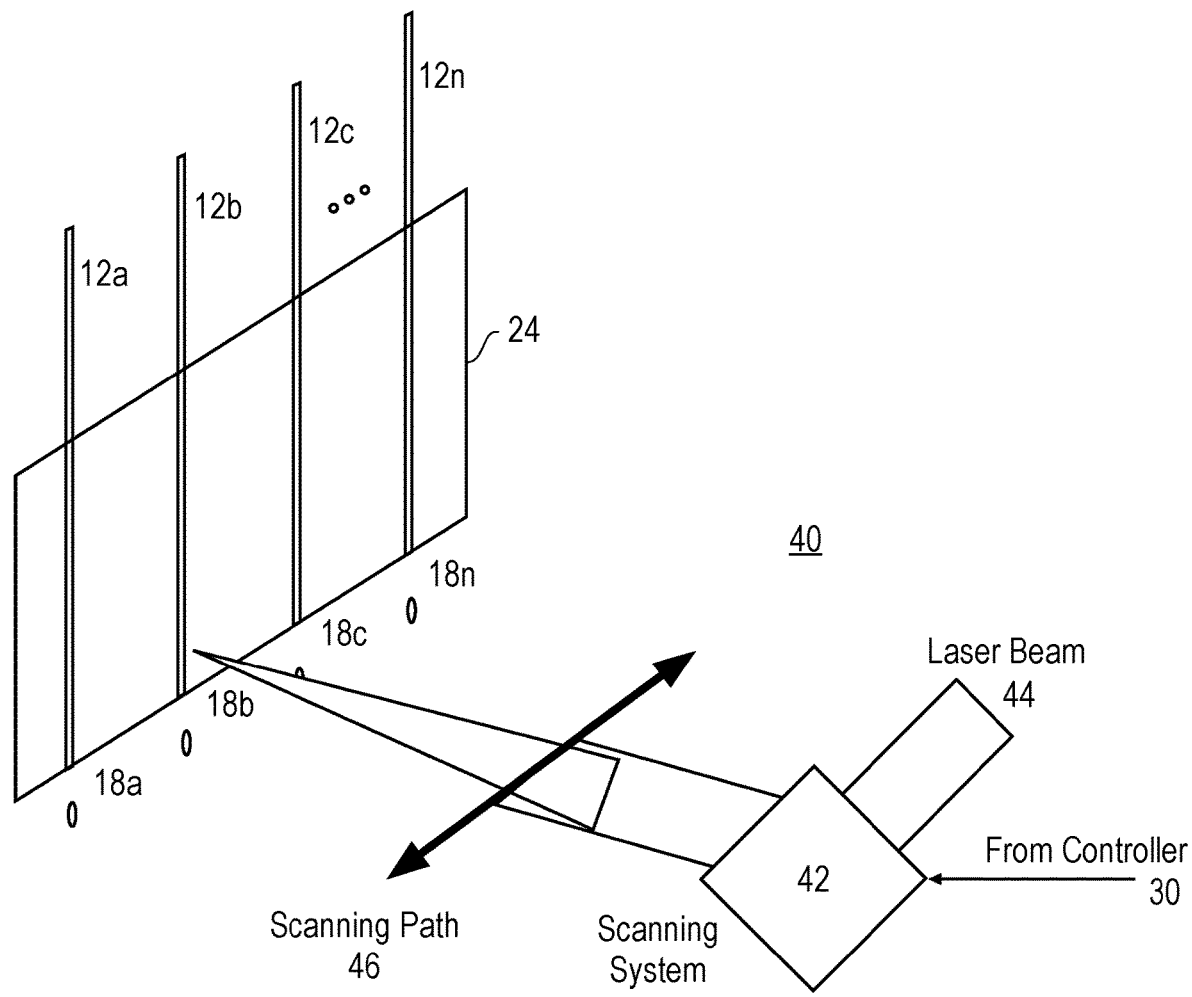
FIG. 5 illustrates yet another embodiment of the present invention that includes multiple metal micro wires and a scanning laser arrangement.

FIG. 5 illustrates one embodiment of the present invention that includes multiple metal micro wires 12a-12n, and a scanning laser arrangement 40. In this example, multiple metal micro wires 12a-12n are guided via a common supporting glass substrate arrangement 24, and a scanning laser arrangement 40 is used to scan (under the control of a controller 30) a single laser beam 44 over a scanning path 46 so that the beam (when activated) is incident upon one of the desired nozzle areas 18a-18n associated with a respective one of the micro wires 12a-12n. Scanning of the laser beam may be effected using a scanning mirror or other arrangement (e.g., an acousto-optic deflector). The laser may be pulsed, as discussed above, so that it is not in continuous operation during scanning of the beam. By using a scanning arrangement of this kind, a single laser may be employed with multiple spools of metal micro wire.

Figure 6:
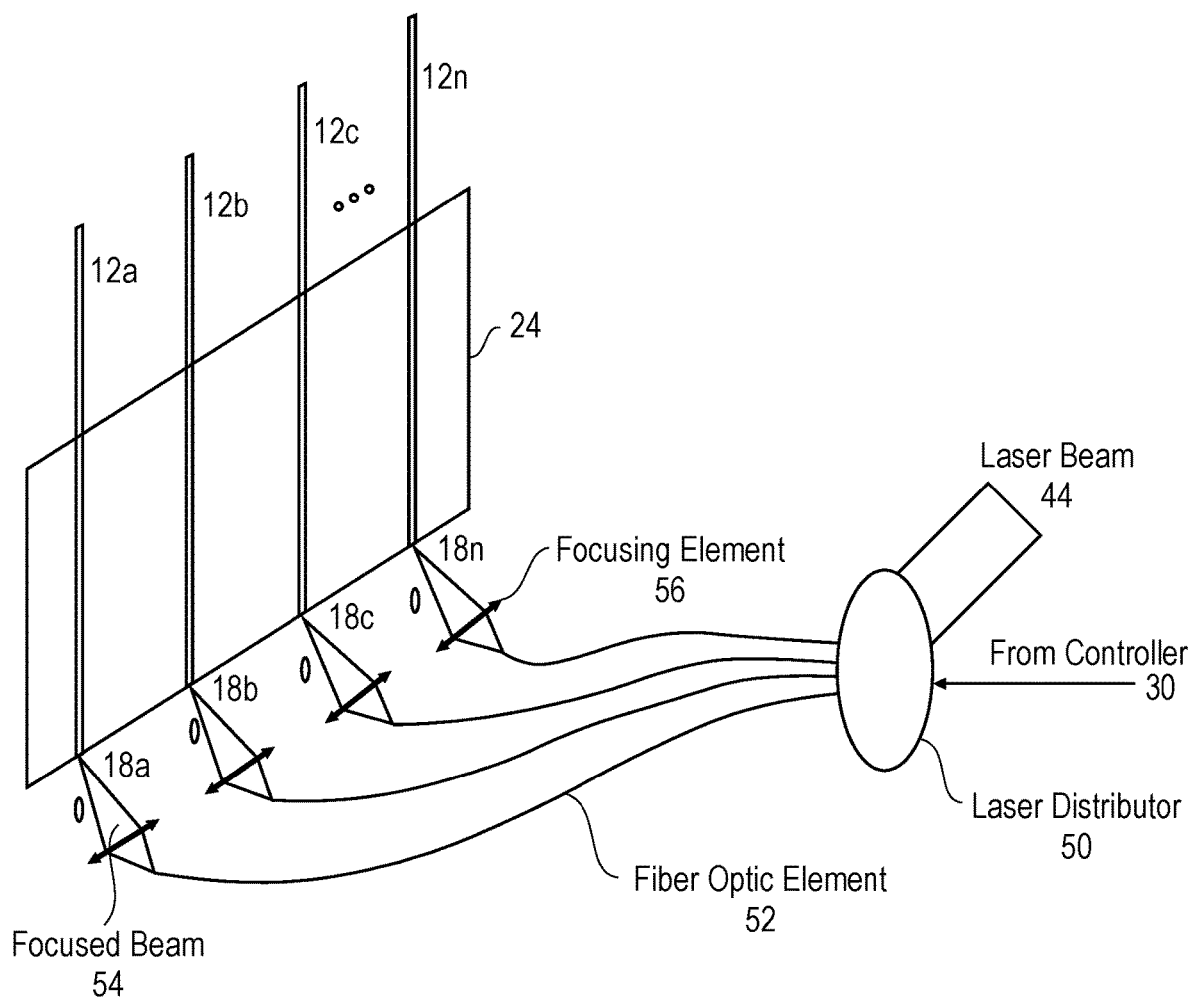
FIG. 6 shows an arrangement similar to that illustrated in FIG. 5, however, in this instance the scanning laser arrangement has been replaced by a laser beam distributor which distributes the laser beam to individual fiber optic transmission lines, one each associated with an individual nozzle area.

FIG. 6 shows an arrangement similar to that illustrated in FIG. 5, however, in this instance the scanning laser arrangement has been replaced by a laser beam distributor 50 which distributes the laser beam 44 to individual fiber optic transmission lines 52, one each associated with nozzle areas 18a-18n. The fiber optic distributor may include arrangements of mirrors, lenses, beam splitters, diaphragms, etc., that operate under the control of controller 30 so as to provide laser pulses to selected ones of nozzle areas 18a-18n for the creation of metal droplets. Near each nozzle area, the fiber optic transmission lines terminate at or near focusing elements (e.g., lens arrangements) that focus 54 the emitted laser light onto the respective metal micro wires at the respective nozzle areas. This is another way in which a single laser may be employed with multiple spools of metal micro wire.

Figure 7:
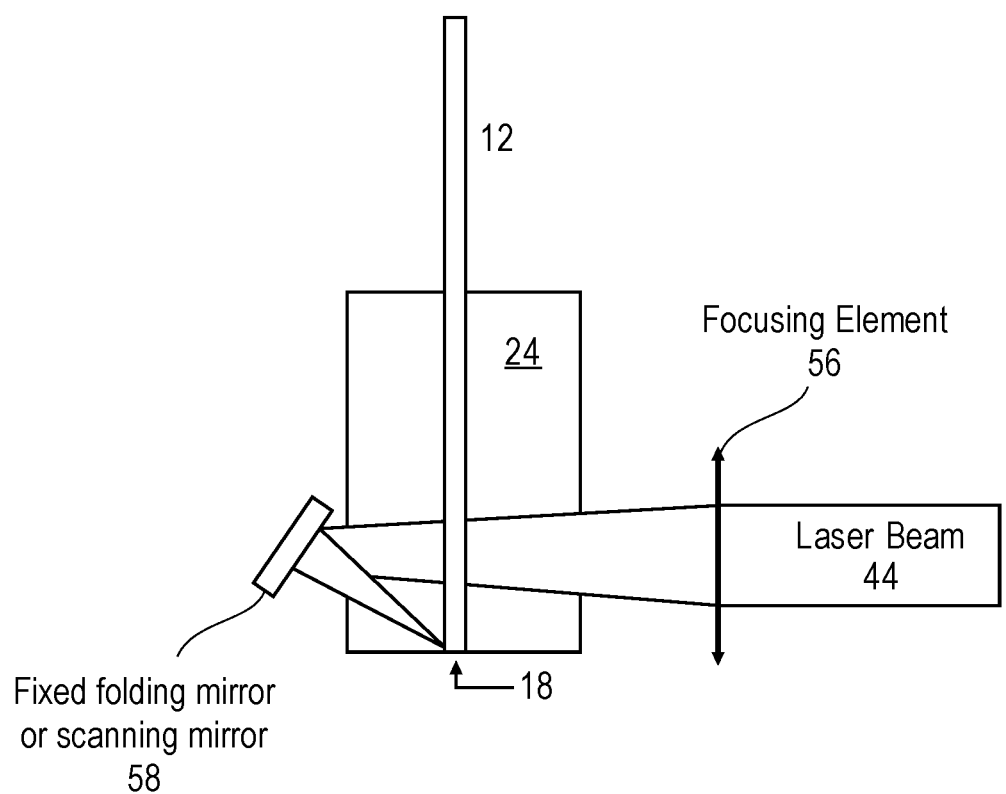
FIG. 7 shows a close up of a nozzle area and one example of a scanning or focusing arrangement for embodiments of the present invention.

FIG. 7 shows a close up of a nozzle area 18 and one example of a scanning or focusing arrangement for embodiments of the present invention. In this example, a laser beam 44 is focused by a one or more focusing elements 56 (e.g., lenses) to be incident upon a mirror 58, which redirects the beam on the metal wire 12 so that its point of focus is at or near the nozzle area 18. In some cases, the mirror may be a scanning mirror which also scans the beam 44 across multiple metal wires (not shown in this figure). Alternatively, where focusing elements 56 are not used, the mirror 58 may be a focusing mirror (e.g., a mirror having a concave parabolic curvature) that focuses the beam 44 onto the metal wire 12 near nozzle area 18.

Figure 8A:
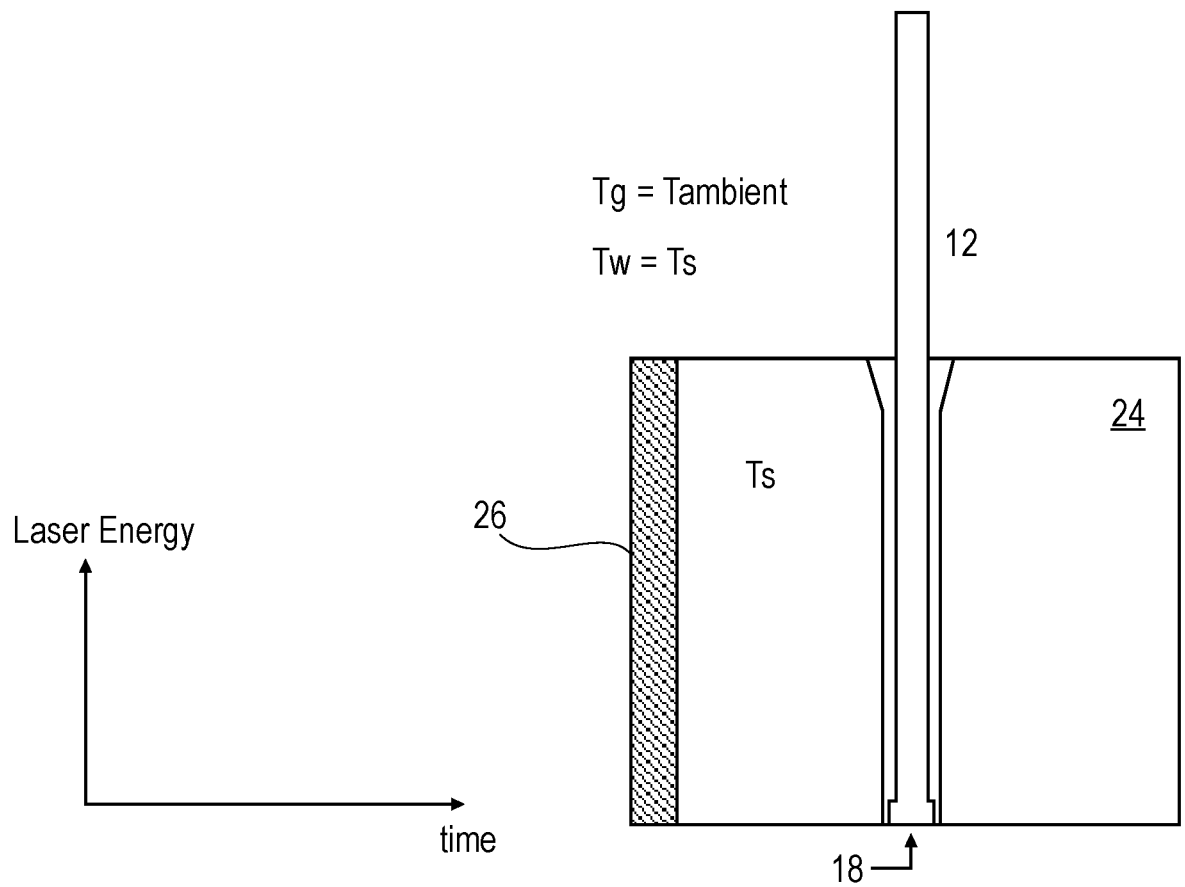
FIGS. 8A-8H illustrate steps in a process for metal droplet jetting in accordance with some embodiments of the present invention.

FIGS. 8A-8H illustrate steps in a process for metal droplet jetting in accordance with some embodiments of the present invention. In FIG. 8A, the metal micro wire 12 is in position within the through hole of glass substrate 24, with the end of the micro wire disposed at or near the nozzle area 18. The temperature of the glass substrate, $T_s$, is at or near the ambient temperature of the environment $T_{ambient}$, and the temperature of the micro wire, $T_w$, is at or near that of the glass substrate, $T_s$. No laser pulse has yet been applied to the wire and heating element 26 is not applying any heat to the glass substrate.

Figure 8B:
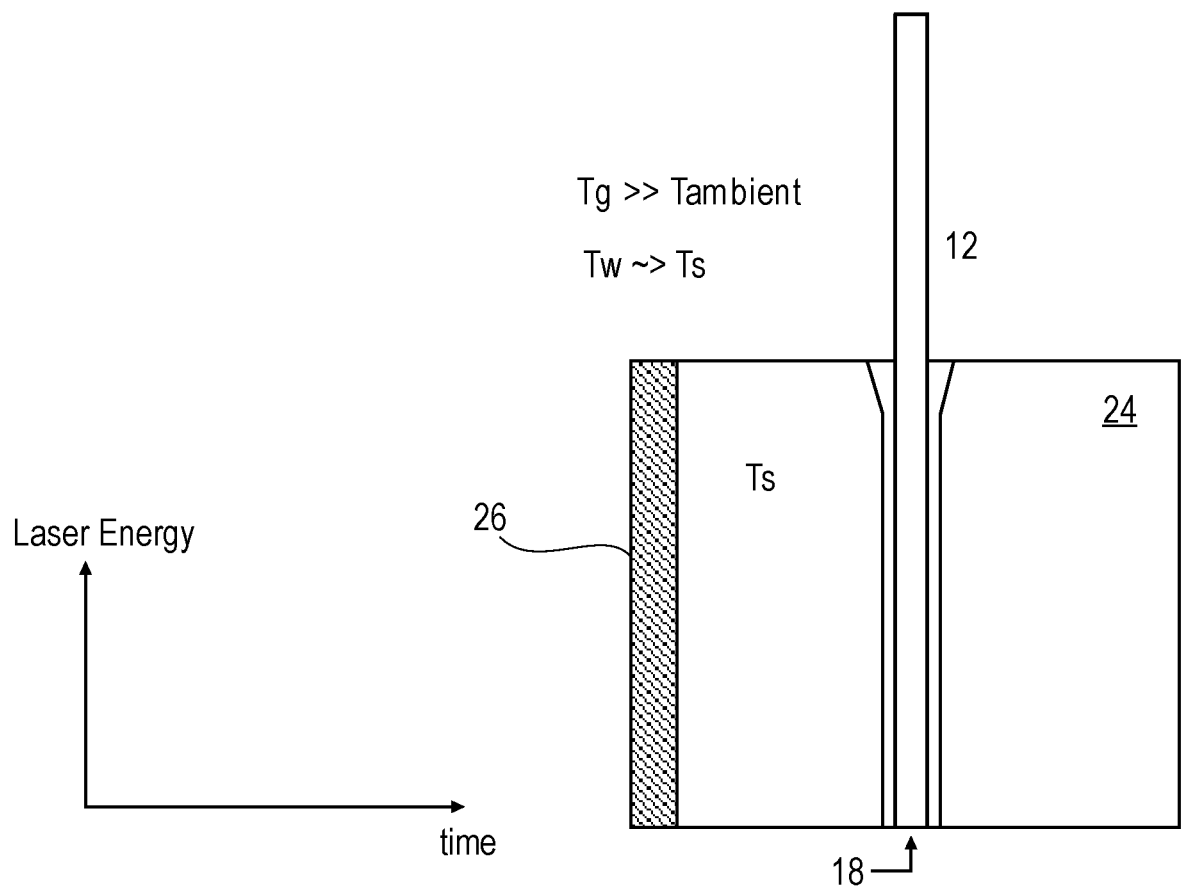

In FIG. 8B, heater 26 has been activated and is heating the glass substrate 26 so that $T_s \gg T_{ambient}$. Preferably, the glass substrate 26 is made of a material having very good thermal conductivity and a low coefficient of thermal expansion, e.g., fused silica, fused quartz, or ceramic glass, and so heat is conducted through the glass substrate to heat metal micro wire 12 so that $T_w \sim > T_s$. No laser pulse has yet been applied to the wire.

Figure 8C:
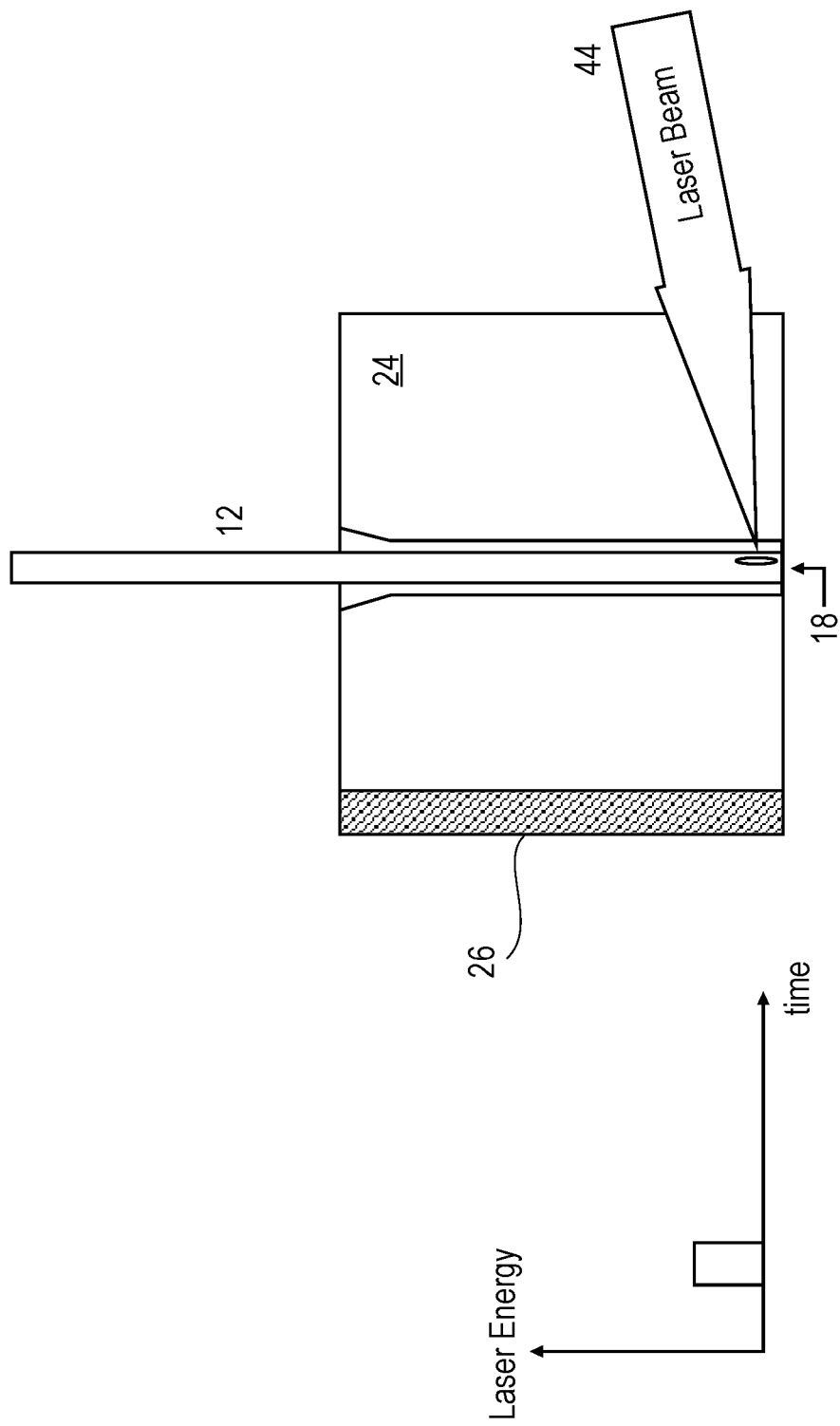
Figure 8D:
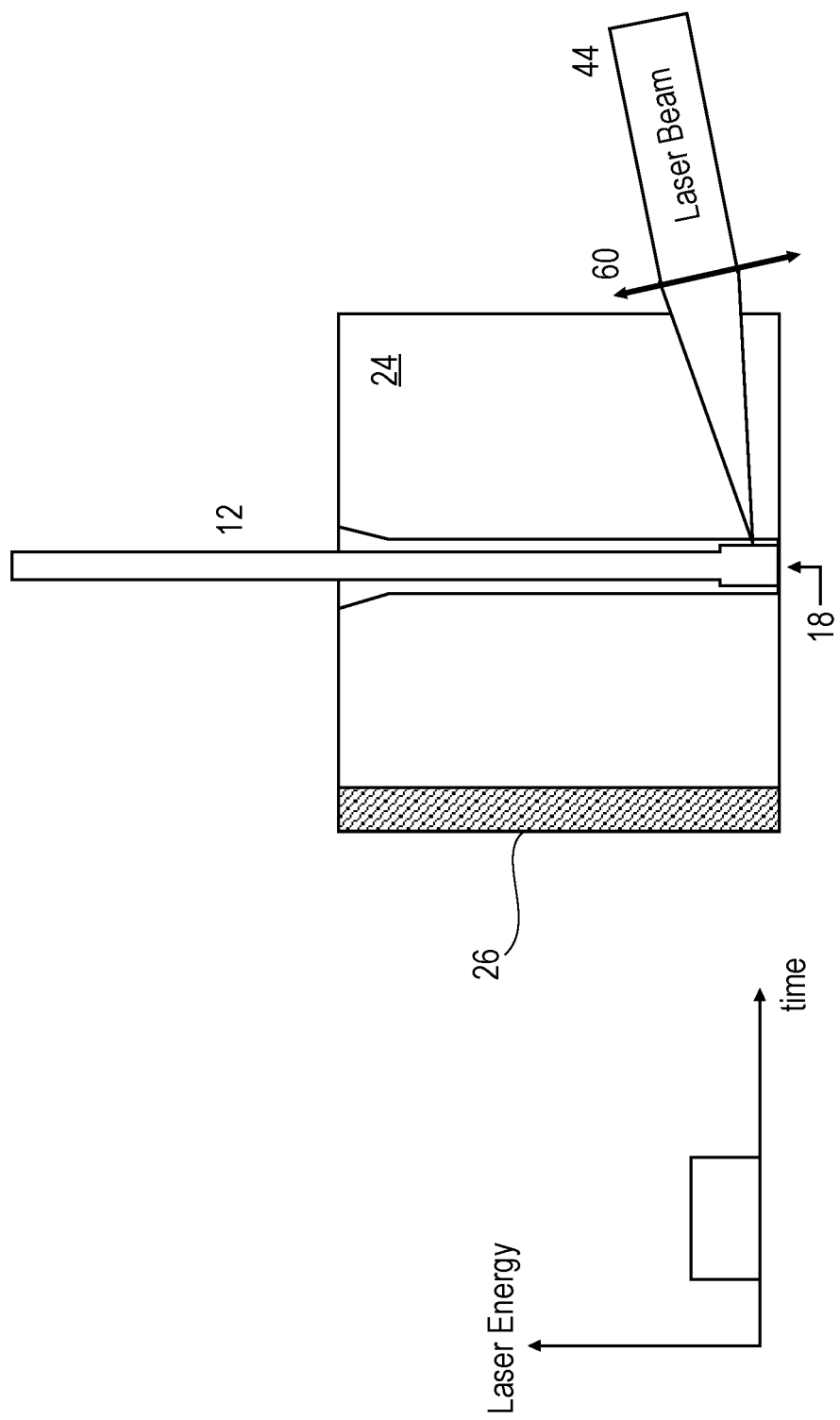

In FIG. 8C, when $T_w$ has reached a desired temperature, or after application of heat from heater 26 for a desired time, laser pulse 44 is applied (under the control of the controller, not shown) to the metal micro wire at a location near the nozzle area 18. The application of the laser pulse causes the metal micro wire to be heated to temperatures near or at its melting point, but only in a localized area near the point at which the laser pulse is applied (the time of the process illustrated in FIGS. 8C-8D will determine the size of the localized area). As shown in FIG. 8D, as the laser pulse continues to be applied, the area of local heating of the metal micro wire increases so that the wire is heated throughout its cross-section over a small longitudinal extent. To assist in creating this area of local heating, the laser beam 44 may be scanned, e.g., under the control of the controller using a small mirror, moveable lens, or other scanning arrangement, over a small extent of the micro wire as it is positioned in the through hole of the glass substrate 24 near the nozzle area 18. Scanning the laser beam in this fashion may provide for creation of a metal droplet in a more uniform fashion than if one is allowed to form from application of a stationary beam. Alternatively, a single laser beam could be decomposed into multiple beams and/or shaped to an ellipsoid or other cross-section (e.g., by lenses), to cover a greater extent of the metal micro wire.

Figure 8E:
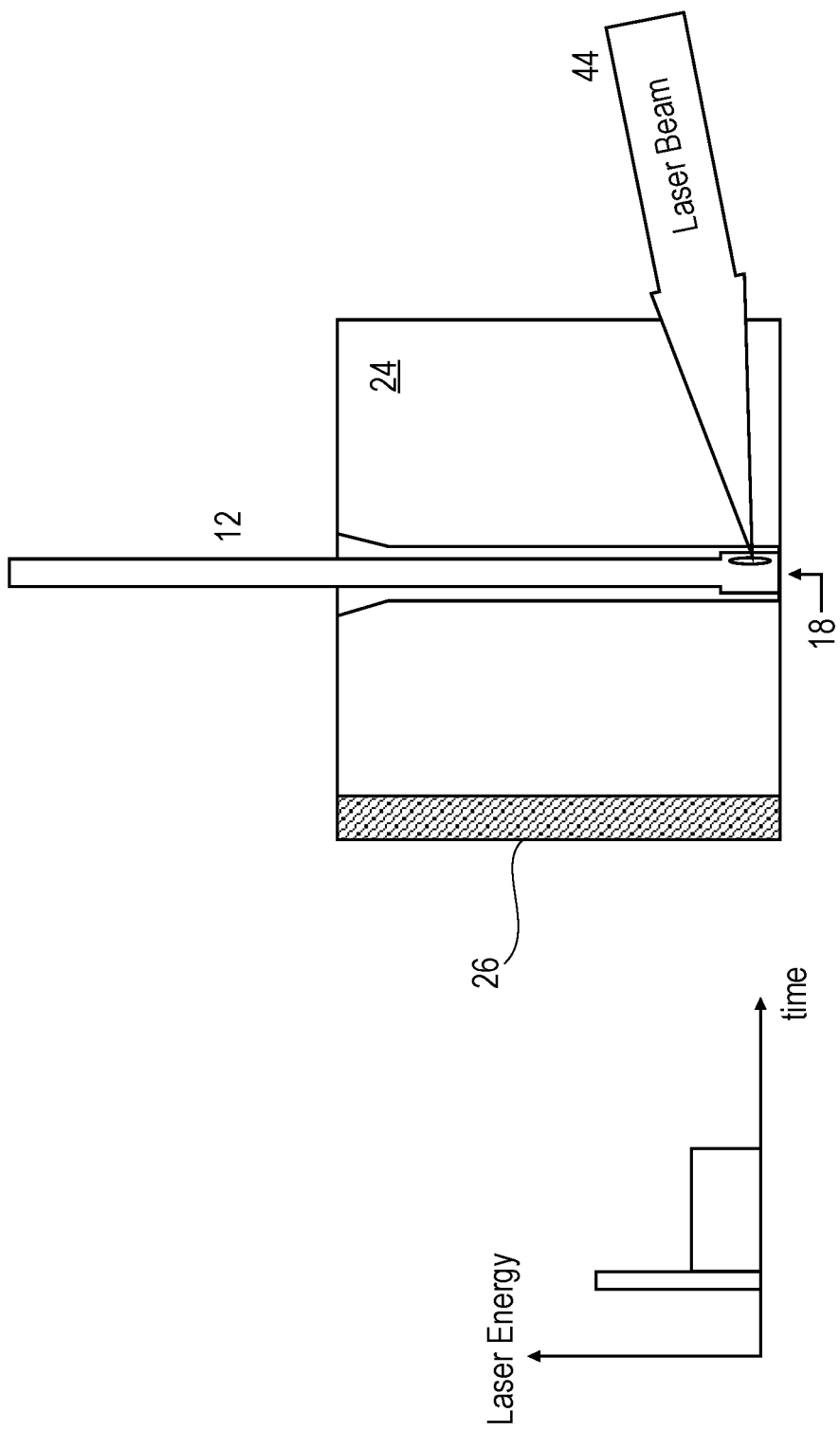
Figure 8F:
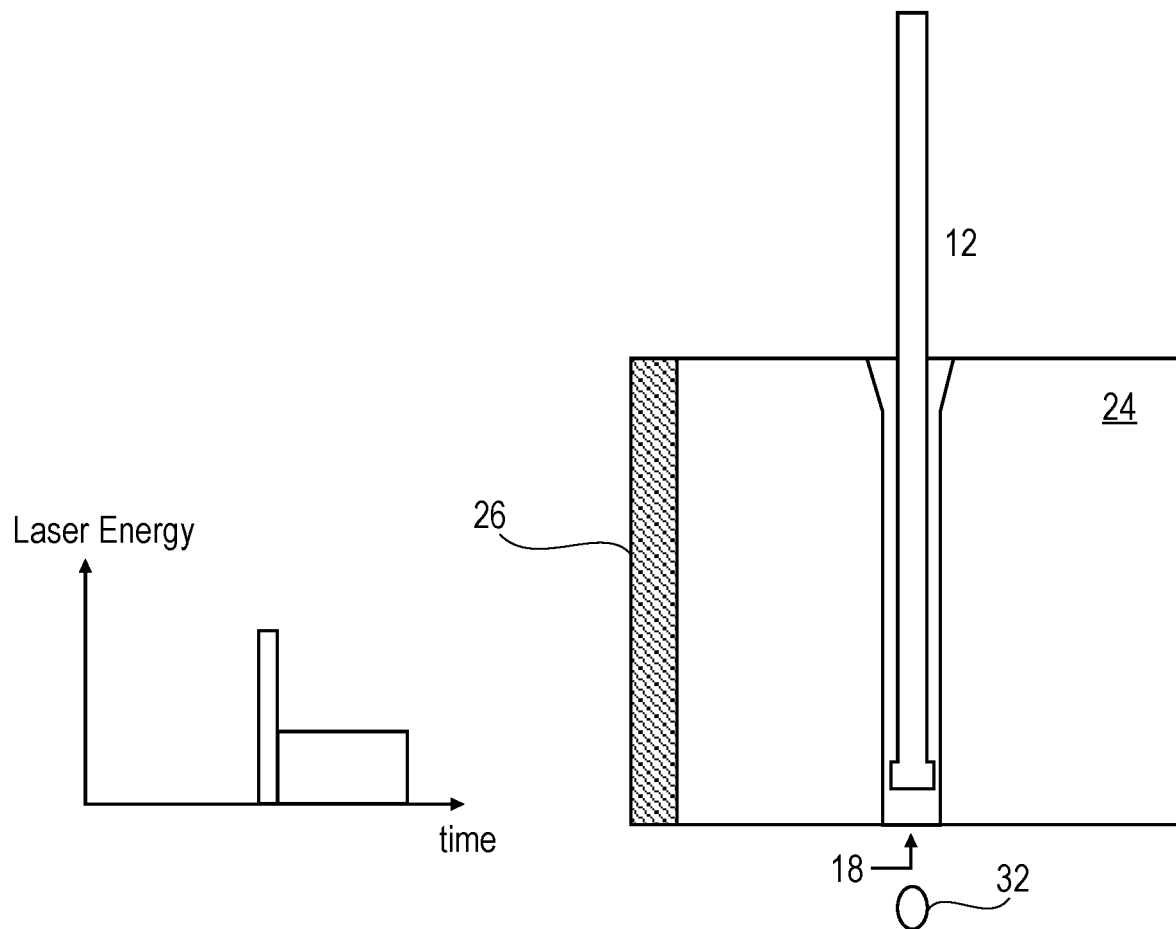

In FIG. 8E, in order to promote expulsion of the metal droplet, the energy of the laser pulse may be briefly increased, as shown in FIG. 8F, causing the molten metal to vaporize, thereby disassociating and expelling the droplet 32 from the rest of the metal micro wire 12 through nozzle 18. Upon formation of the metal droplet 32, the laser pulse is discontinued. This may be based on visual feedback provided by a camera monitoring system, or based on time of application of the pulse, or both. For example, the controller may be programmed to discontinue the laser pulse after a time, $T_{pulse}$, since it was initiated, unless visual feedback indicates that a droplet 32 is earlier formed, at which point the controller may discontinue application of the laser pulse.

Figure 8G:
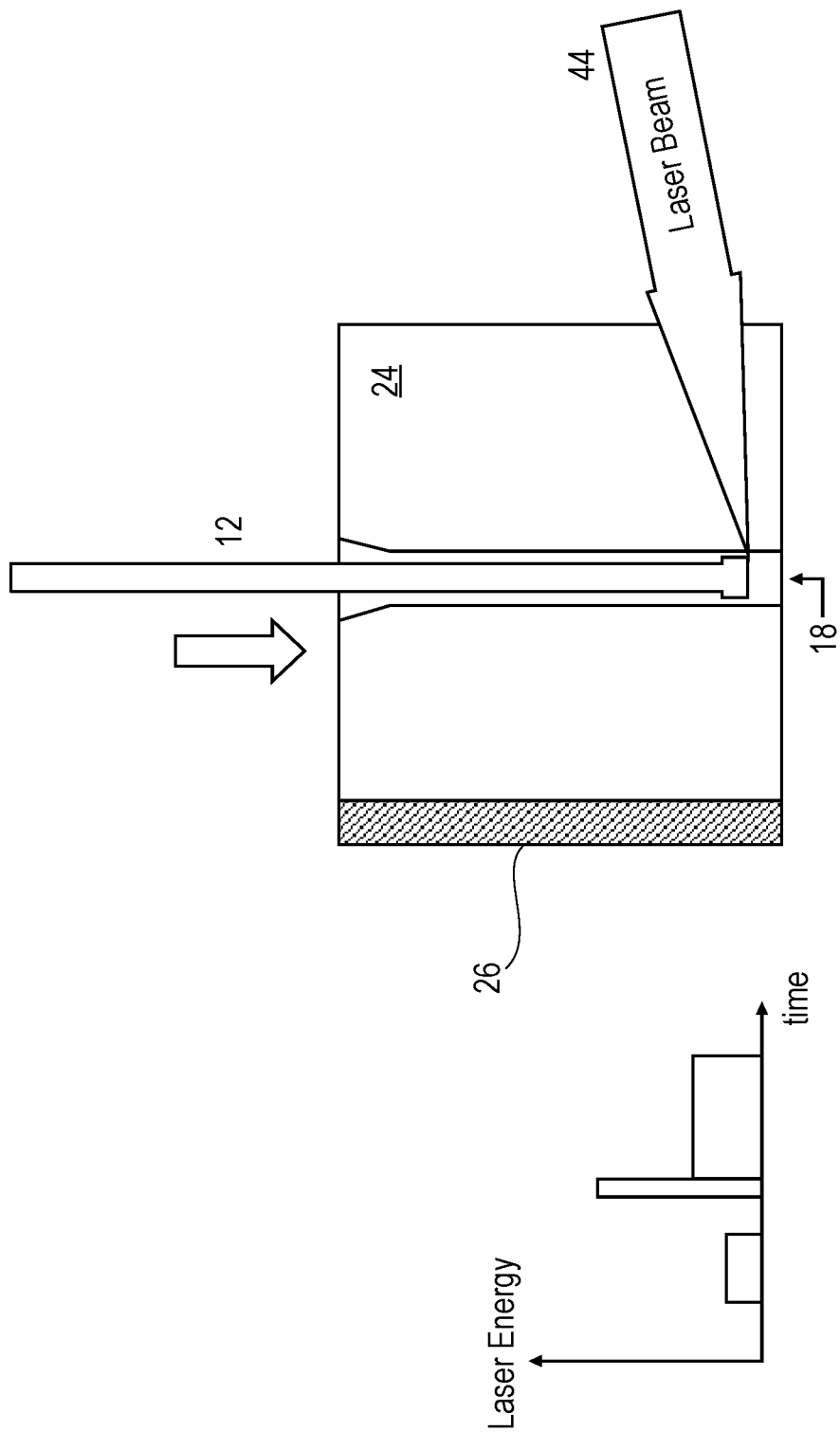
Figure 8H:
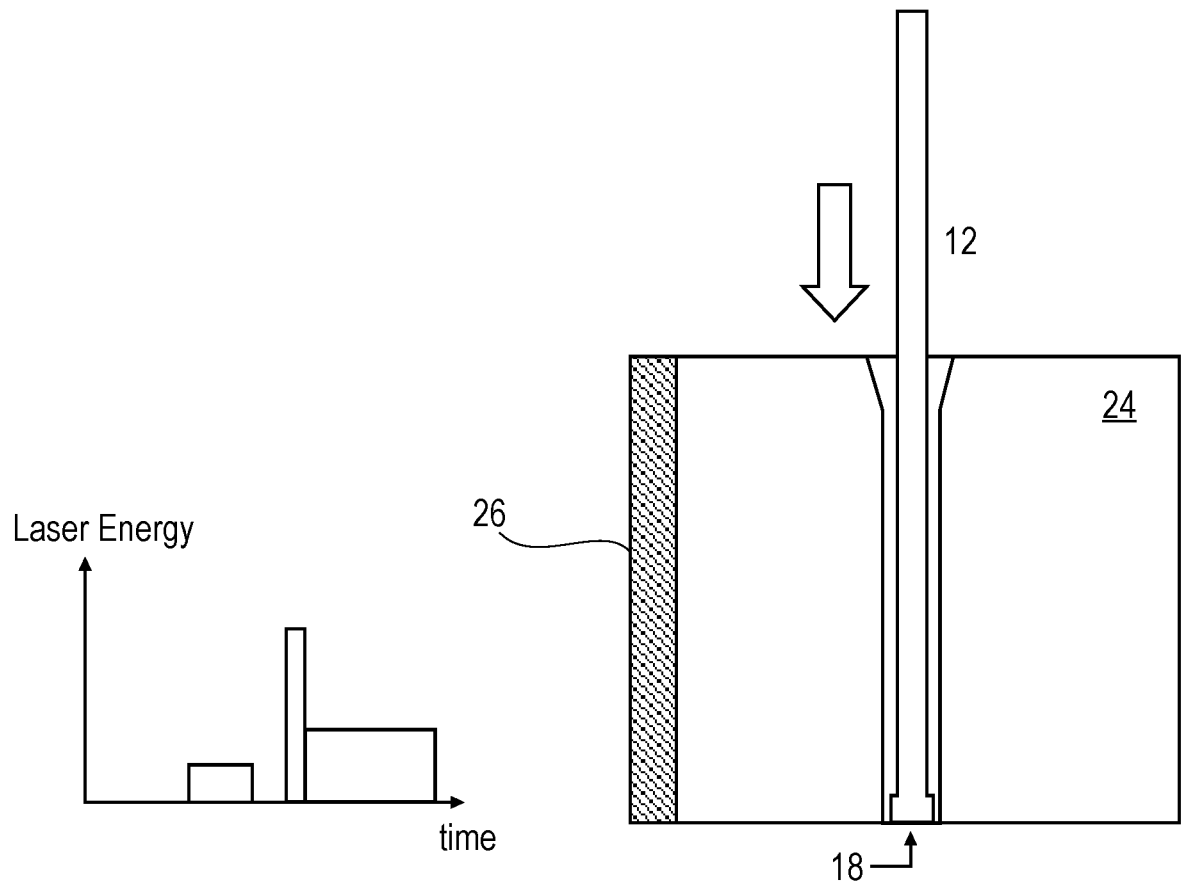

As shown in FIG. 8G, after a droplet has been formed and expelled, the laser beam 44 is again applied to the end of the metal micro wire, which is now displaced some distance above the nozzle area 18 at the end of the through hole in the glass substrate. The change in focal point of the laser beam may be made under the control of the controller by displacing the beam through an arc of known magnitude using mirrors, movable lenses, or other scanning arrangement. The application of the laser to the end point of the metal wire is timed to take place at or about the same time as the piezo translator (not shown in this illustration) is active to translate the wire towards the nozzle area 18. Heating the wire in this fashion assists in the translation operation by ensuring that the end of the wire, which has now cooled somewhat from temperatures reached during previous application of the laser pulse, do not adhere to the sidewalls of the through hole, thereby impeding movement of the wire within the through hole of the glass substrate. The piezo translator is operated, under control of the controller, to move the wire a distance sufficient to bring the end of the wire close to the nozzle area 18, as shown in FIG. 8H, so that the foregoing process may be repeated for the next metal droplet. This may again be a timed operation, or one conducted using visual feedback from a camera monitoring system, or both.

Figure 9:
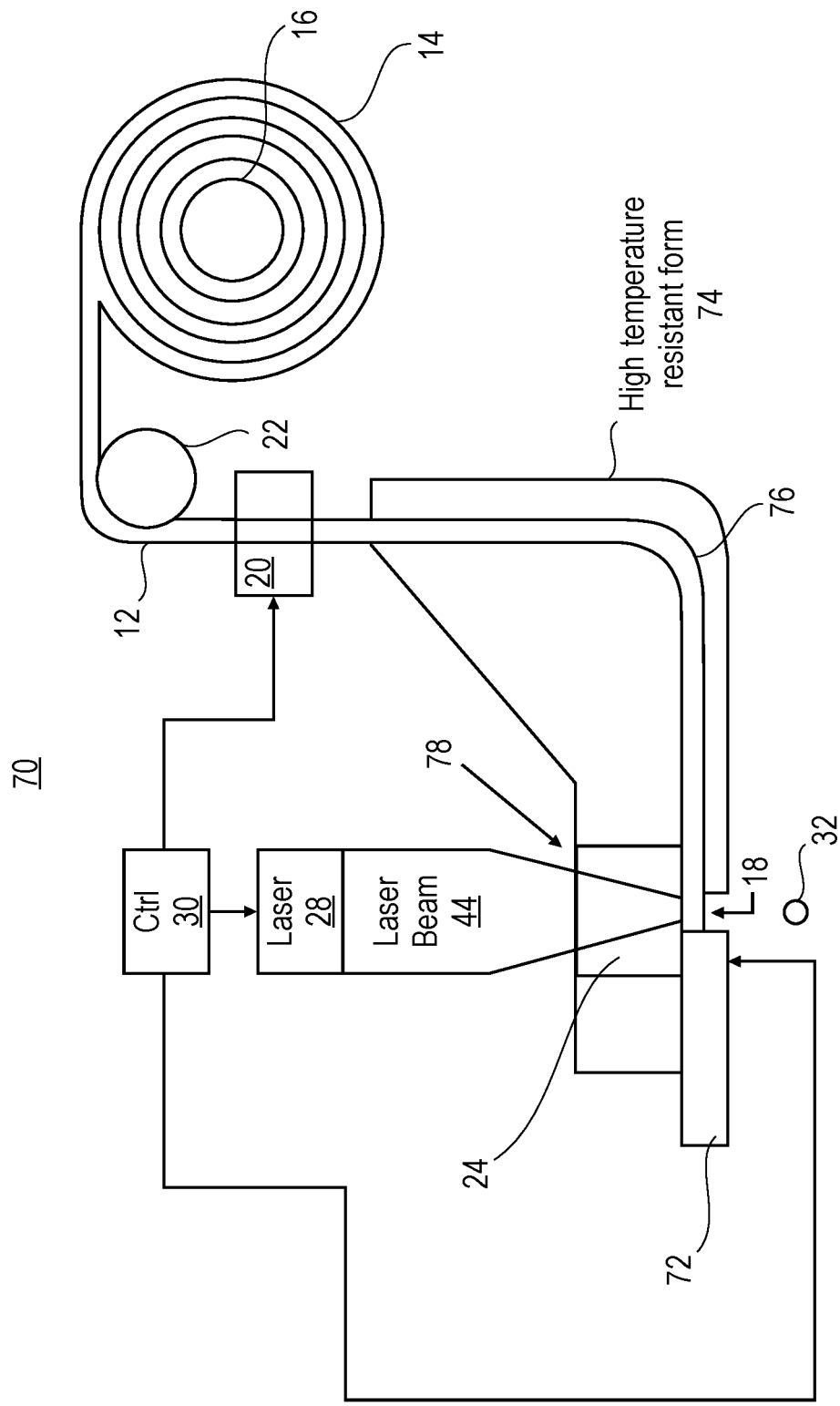
FIG. 9 illustrates yet another embodiment of the present invention in which a portion of a reaction area above a metal wire is filled with a glass substrate.
Figure 10:
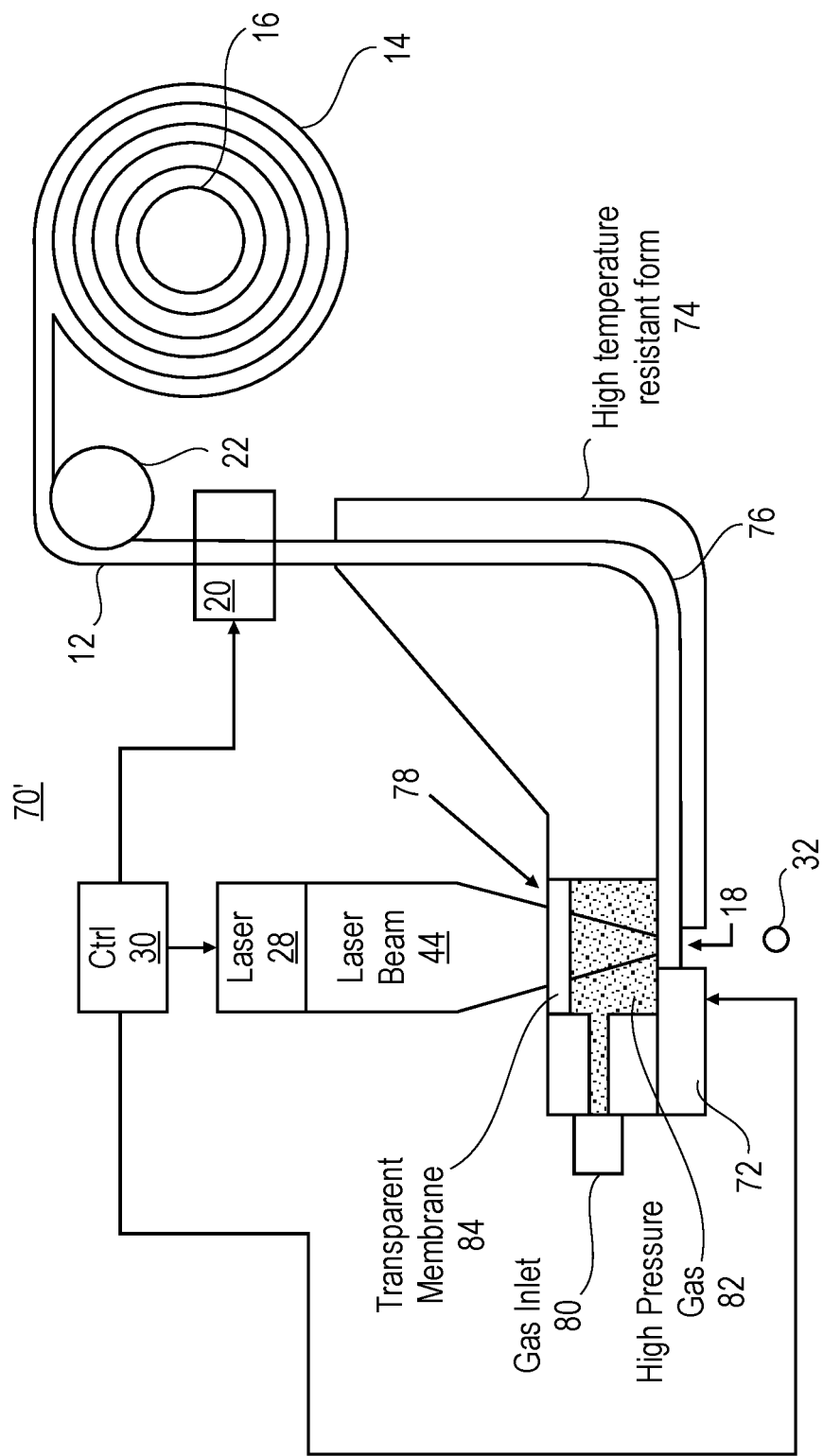
FIG. 10 illustrates an embodiment of the present invention in which a portion of a reaction area above a metal wire is filled with a high-pressure gas, introduced through a gas inlet.

FIGS. 9 and 10 illustrate, respectively, systems 70 and 70', which are alternative arrangement for a metal jetting system configured in accordance with further embodiments of the present invention. In these examples, the metal micro wire is organized in a spool 14 which is carried on a reel 16, and is fed towards a nozzle area 18 by a piezo translator 20 via one or more rollers 22. Along the way, the metal wire 12 passes through a form 74, made of a high temperature resistant material, e.g., one with a very low coefficient of thermal expansion. The metal micro wire 12 is supported along its length in a through hole 76 (which may have a tapered entrance) of the high temperature resistant form 74, which may be articulated to change the orientation of the wire from a first, vertical plane, to a second, horizontal plane. Examples of materials which may be used for form 74 include fused quartz, fused silica, and ceramic glass.

Within the form 74 is a reaction area 78. Reaction area 78 may be cylindrical or rectangular in cross section, and extends through form 74, exposing wire 12 on both sides such that when wire 12 is threaded through the through hole 76 it exits the form within the reaction area 78. In system 70, shown in FIG. 9, the portion of the reaction area 78 above the metal wire 12 is filled with a glass substrate 24 having properties similar to those described above. Below the metal wire 12, the reaction area 78 is tapered or of a reduced diameter, so that nozzle area 18 is formed. In this example, a portion of the reaction area sidewall is removed, and replaced with a piezo translator 72. In system 70' shown in FIG. 10, the portion of the reaction area 78 above the metal wire 12 is filled with a high-pressure gas, preferably an inert gas such as Argon or Helium, introduced through gas inlet 80. Below the metal wire 12, the reaction area 78 is tapered or of a reduced diameter, so that nozzle area 18 is formed. A portion of the reaction area sidewall is removed, and replaced with a piezo translator 72. In this example, rather than a heat resistant glass substrate, a thin, transparent (at the wavelength of the laser pulse) membrane 84 may be used as a cap for the reaction area 78. The transparent membrane may be made of fused quartz, fused silica, or ceramic glass, or a less expensive material such as a tempered glass. The use of a gas within reaction area 78 as in this example helps to minimize or prevent oxidation of that portion of metal wire 12 exposed within the reaction area 78.

With systems 70 and 70', laser 28 emits, under the control of controller 30, a pulse, preferably in the IR wavelengths, e.g., at or about 1 nm-10 nm, towards the portion of metal wire 12 exposed above nozzle area 18, where the end of the metal micro wire has been positioned by piezo translator 20. The energy imparted by the laser light is primarily absorbed by the metal micro wire, causing the end portion of the metal micro wire, which has a diameter on the order of 10 microns, near the nozzle area to be heated very rapidly. Local heating of the metal micro wire caused by the laser beam 44 causes a droplet of metal 32 to be jetted from the nozzle area 18. Although not shown in these illustrations, the nozzle area 18 may be in close proximity to a receiving substrate on which the droplet 32 is deposited. Jetting overlapped metal droplets in this fashion in shapes defined by cross-sections of the object being manufactured results in the formation of the object. Formation of a metal droplet in systems such as 70 and 70' is similar to that described above, with the laser 28 being activated for pulses to heat the wire in areas adjacent nozzle area 18, causing the wire to melt and form droplets which are jetted out. As discussed in greater detail below, piezo transducer 72 may be actuated, under the control of controller 30, during formation of the droplet to assist in its ejection from the nozzle area 18 and/or adjusted to control the amount of wire 12 exposed to the laser so as to control the size of the droplet. In embodiments were a high-pressure gas 82 is used, the gas likewise assists in expelling the metal droplet 32 towards the receiving material.

Figure 11:
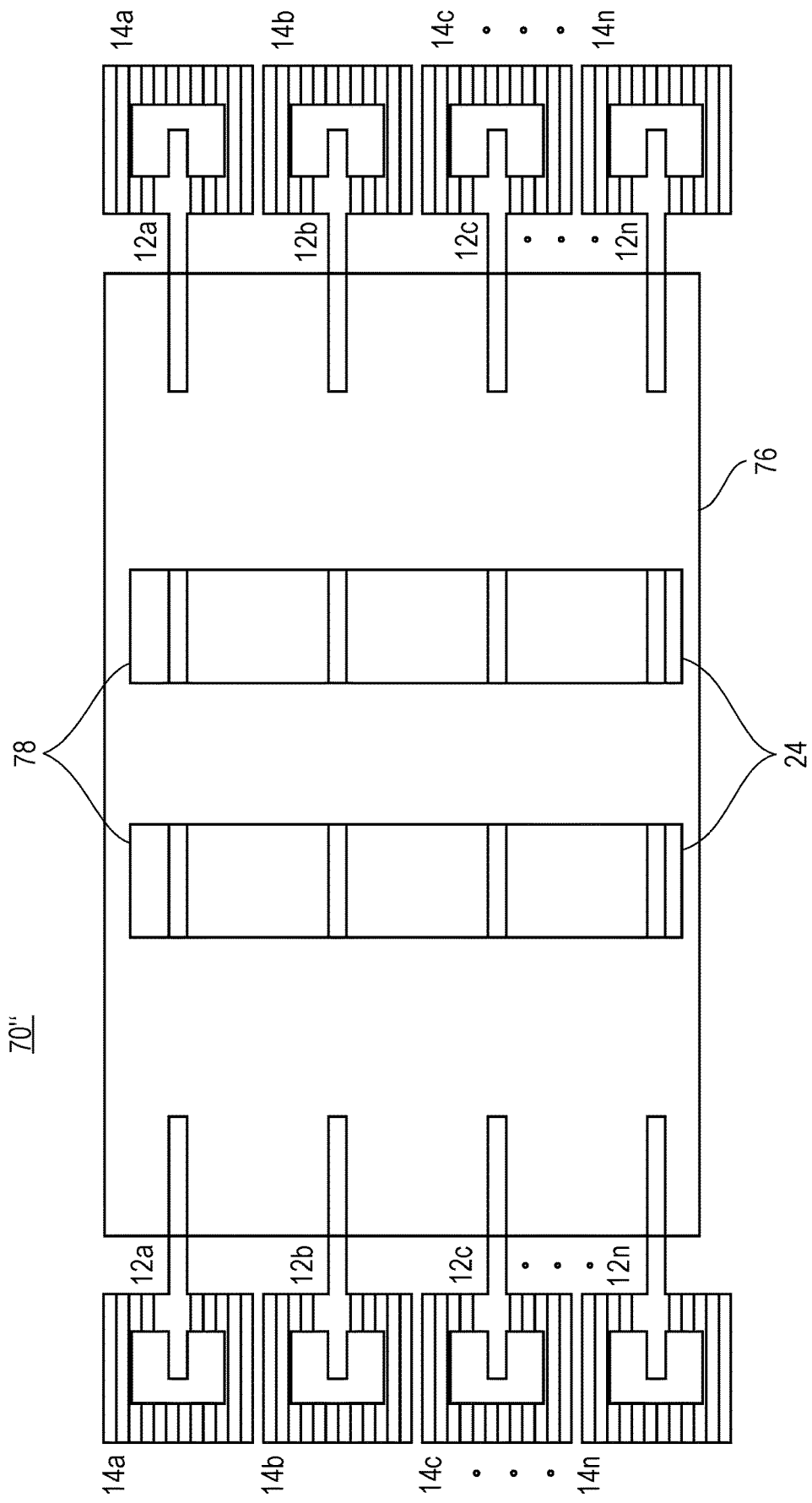
FIG. 11 is a top view of a system that includes opposing pairs of multiple spools of metal micro wires, some or all of which may be of different kinds of metals, arranged in systems similar to that illustrated in FIGS. 9 and 10 and sharing a common form.

FIG. 11 is a top view of a system 70", which includes opposing pairs of multiple spools 14a-14n of metal micro wires 12a-12n, some or all of which may be of different kinds of metals, arranged in systems similar to that illustrated in FIGS. 9 and 10, and sharing a common form 76. Although this example is illustrated with a glass substrates 24, similar systems may be used with membranes 84 and associated high pressure gas systems.

Figure 12A:
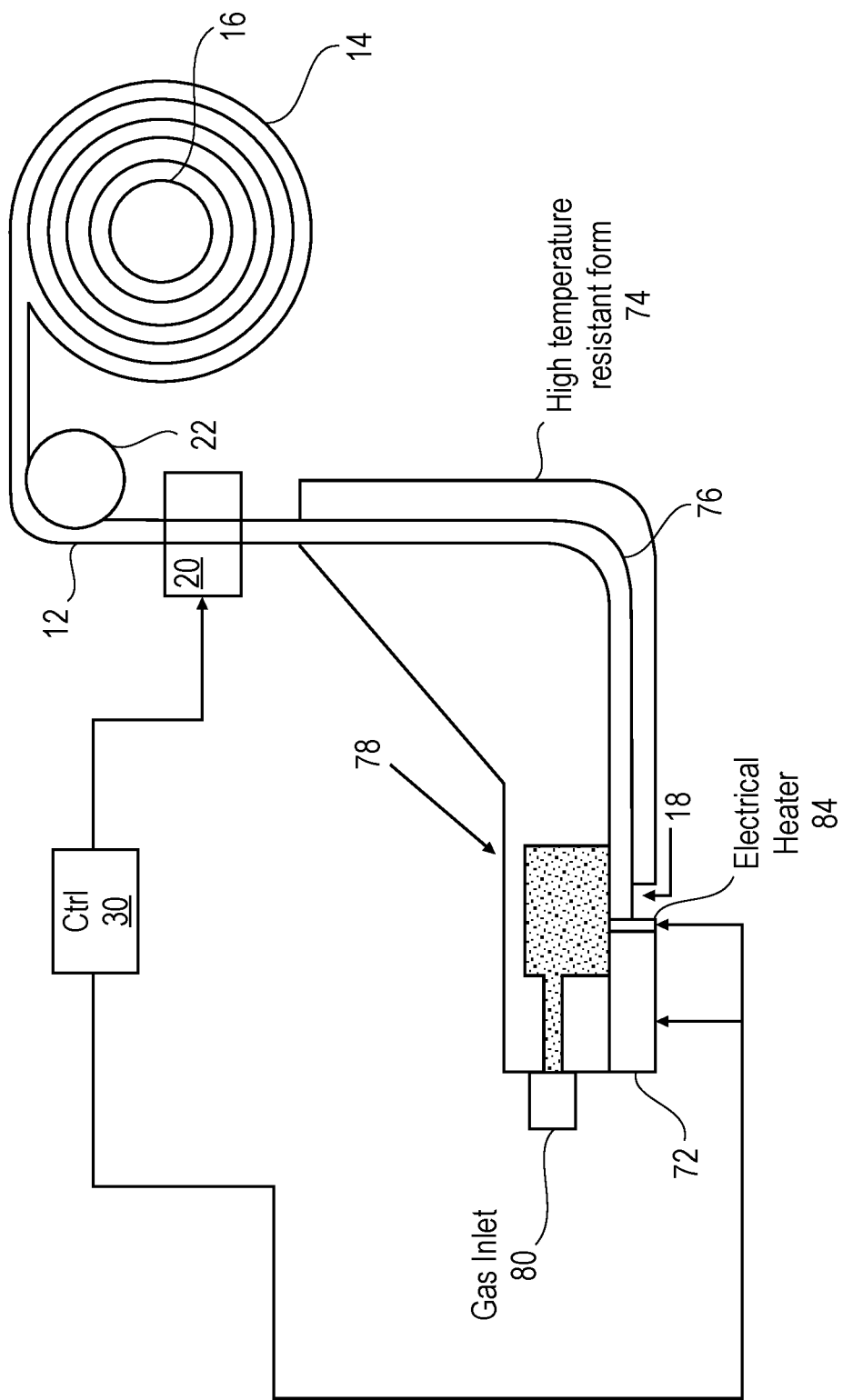
FIGS. 12A and 12B show variants of the systems depicted in FIGS. 9 and 10 but replace a laser with an electric heater positioned on an end of a piezo translator.
Figure 12B:
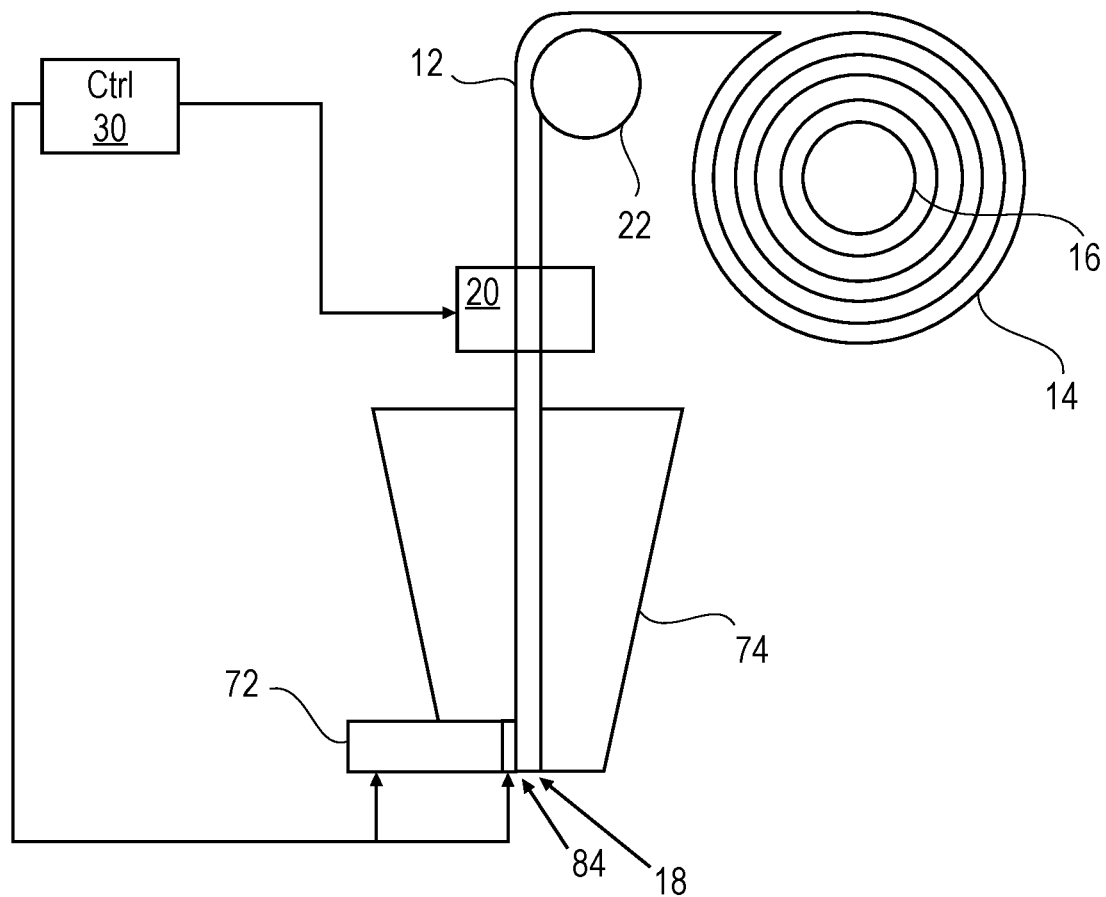

FIGS. 12A and 12B show variants of the systems depicted in FIGS. 9 and 10, but replace the laser 28 with an electric heater 84 positioned on the end of the piezo translator 72. In the example shown in FIG. 12A, the metal micro wire 12 is organized in a spool 14 which is carried on a reel 16, and is fed towards a nozzle area 18 by a piezo translator 20 via one or more rollers 22. Along the way, the metal wire 12 passes through a form 74, made of a high temperature resistant material, e.g., one with a very low coefficient of thermal expansion. The metal micro wire 12 is supported along its length in a through hole 76 (which may have a tapered entrance) of the high temperature resistant form 74, which may be articulated to change the orientation of the wire from a first, vertical plane, to a second, horizontal plane. Examples of materials which may be used for form 74 include fused quartz, fused silica, and ceramic glass.

Within the form 74 is a reaction area 78. Reaction area 78 may be cylindrical or rectangular in cross section, and extends partially within form 74, exposing wire 12 on both sides such that when wire 12 is threaded through the through hole 76 it exits the form within the reaction area 78. In the system shown in FIG. 12A, the reaction area 78 is filled with a high-pressure gas, preferably an inert gas such as Argon or Helium, introduced through gas inlet 80. The use of a gas within reaction area 78 as in this example helps to minimize or prevent oxidation of that portion of metal wire 12 exposed within the reaction area 78. Below the metal wire 12, the reaction area 78 is tapered or of a reduced diameter, so that nozzle area 18 is formed. A portion of the reaction area sidewall is removed, and replaced with a piezo translator 72.

An electrical heater 84, operated under the control of controller 30, is affixed to the end of the piezo translator 72 and abuts the exposed end of micro metal wire 12 near the nozzle area 18, where the end of the metal micro wire has been positioned by piezo translator 20. The energy imparted by the electrical heater is used instead of a laser to melt the end of micro wire 12 near the nozzle area 18 and form a metal droplet. Although not shown in the illustration, the nozzle area 18 may be in close proximity to a receiving substrate on which the metal droplet is deposited. Jetting overlapped metal droplets in this fashion in shapes defined by cross-sections of the object being manufactured results in the formation of the object. Piezo transducer 72 may be actuated, under the control of controller 30, during formation of the droplet to assist in its ejection from the nozzle area 18 and/or adjusted to control the amount of wire 12 exposed to the laser so as to control the size of the droplet. In embodiments were a high-pressure gas 82 is used, the gas likewise assists in expelling the metal droplet 32 towards the receiving material.

FIG. 12B shows an alternative arrangement of a system similar to that illustrated in FIG. 12A. In the example shown in FIG. 12B, the metal micro wire 12 is organized in a spool 14 which is carried on a reel 16, and is fed towards a nozzle area 18 by a piezo translator 20 via one or more rollers 22. Along the way, the metal wire 12 passes through a form 74, made of a high temperature resistant material, e.g., one with a very low coefficient of thermal expansion. The metal micro wire 12 is supported along its length in a through hole (which may have a tapered entrance) of the high temperature resistant form 74, oriented in a longitudinal plane of the metal wire. Examples of materials which may be used for form 74 include fused quartz, fused silica, and ceramic glass.

Near the end of the form 74 is nozzle area 18. An electrical heater 84, operated under the control of controller 30, is affixed to the end of a piezo translator 72 and abuts the exposed end of micro metal wire 12 near the nozzle area 18, where the end of the metal micro wire has been positioned by piezo translator 20. The energy imparted by the electrical heater is used instead of a laser to melt the end of micro wire 12 near the nozzle area 18 and form a metal droplet. Although not shown in the illustration, the nozzle area 18 may be in close proximity to a receiving substrate on which the metal droplet is deposited. Jetting overlapped metal droplets in this fashion in shapes defined by cross-sections of the object being manufactured results in the formation of the object. Piezo transducer 72 may be actuated, under the control of controller 30, during formation of the droplet to assist in its ejection from the nozzle area 18 and/or adjusted to control the amount of wire 12 exposed to the laser so as to control the size of the droplet.

Figure 13A:
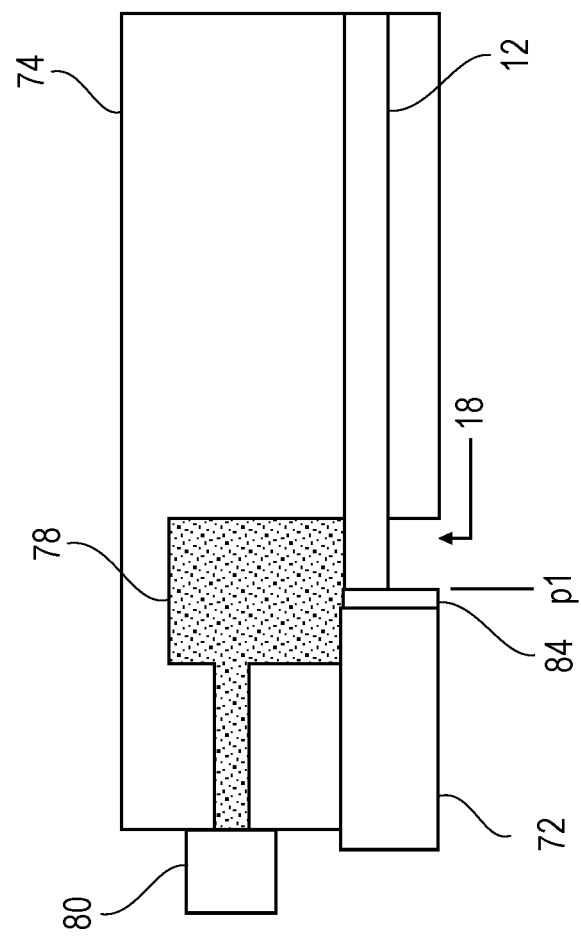
FIGS. 13A-13F illustrate the formation of a metal droplet in systems similar to that shown in FIG. 12A.
Figure 13A:
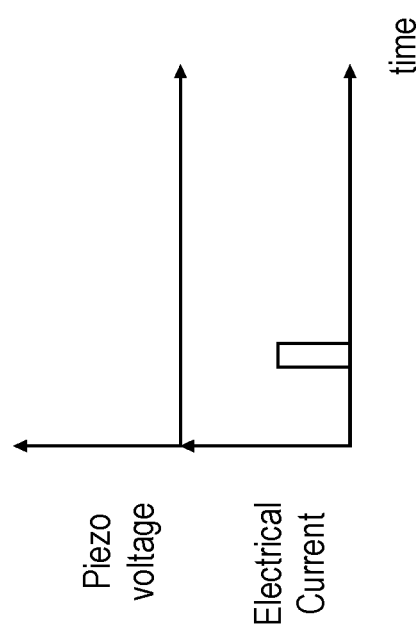

FIGS. 13A-13F illustrate the formation of a metal droplet in systems similar to that shown in FIG. 12A. The same principles of operation apply to systems such as that shown in FIG. 12B. Also, the operation of the piezo transduced 72 is applicable to the systems shown in FIGS. 9-11, even though no heater element 84 need be used in those embodiments. In FIG. 13A, metal micro wire 12 has been positioned by piezo translator 20 (not shown) so that the end of the metal wire is within the nozzle area 18, abutting the heating element 84 at position p1. Heating element 84 is affixed at the end of piezo translator 72 so that when piezo translator 72 is activated, the heating element will be translated in a longitudinal direction with respect to metal wire 12, causing the end of metal wire 12 to deform, as described further below. At the time illustrated in FIG. 13A, piezo translator 72 has not been activated, but an electrical current has been applied to heating element 84. As a result, the end of metal wire 12 is being heated, but it has not yet reached its melting point. In this example, the reaction area 78 is filled with a high-pressure gas, preferably an inert gas such as Argon or Helium, introduced through gas inlet 80. The use of a gas within reaction area 78 helps to minimize or prevent oxidation of that portion of metal wire 12 exposed within the reaction area 78, but is optional. As will be discussed below, the presence of a gas under pressure within the reaction area can assist in jetting a metal droplet out of nozzle area 18 towards a receiving substrate.

Figure 13B:
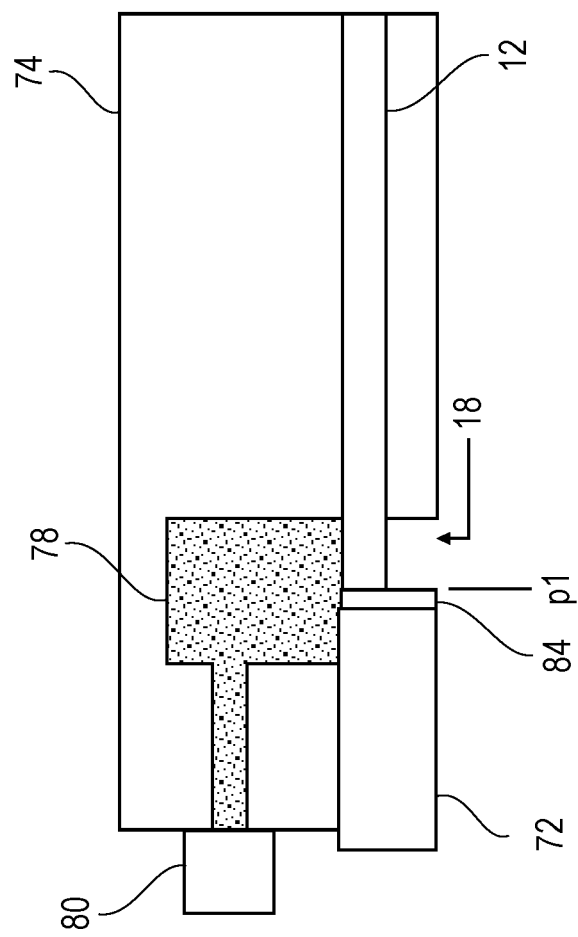
Figure 13B:
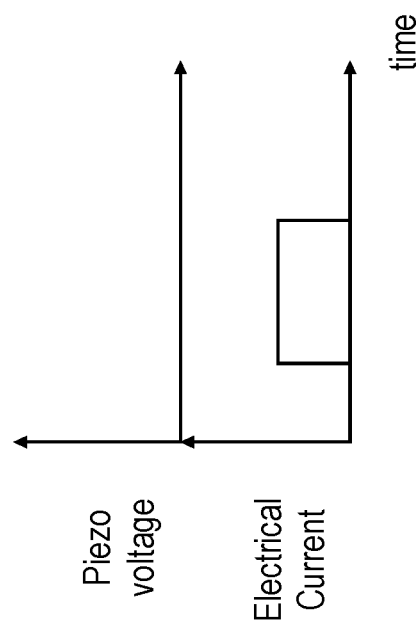

FIG. 13B shows the system a few moments later than at the time depicted in FIG. 13A. As illustrated in the accompanying graphs, the electrical current has been applied to the heating element 84 for some time, such that the metal wire 12 has now been heated throughout its length within the nozzle area 18. The piezo transducer 72 has not yet been activated, hence, the end of heating element 84 is still at positon p1 and metal wire 12 has not yet been deformed.

Figure 13C:
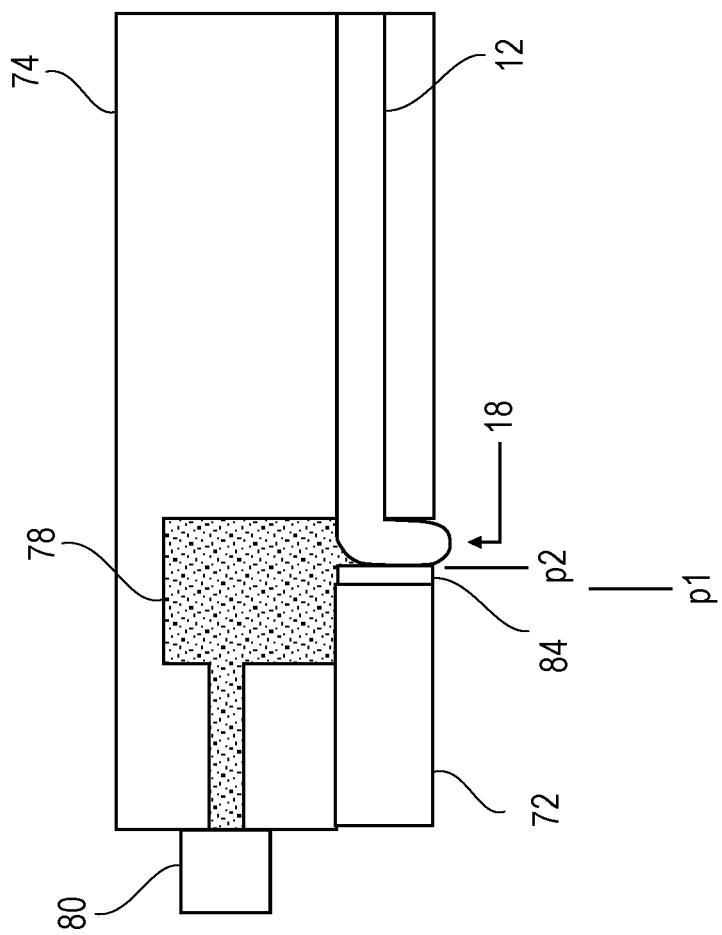
Figure 13C:
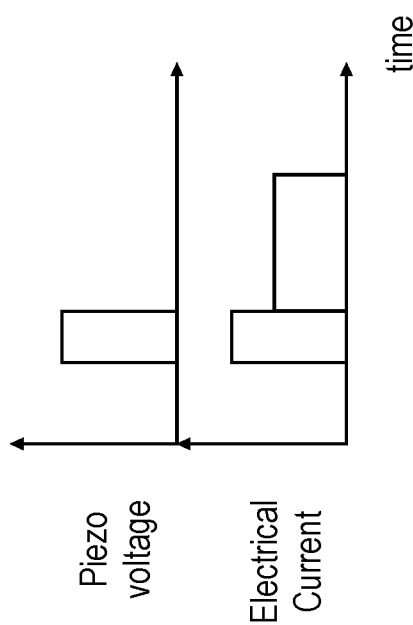

FIG. 13C now shows the system a few moments later than at the time illustrated in FIG. 13B. The magnitude of the electrical current applied to heating element 84 has increased and the piezo transduced 72 has been activated. As a result, the end of metal wire 12 is heated to higher temperatures, allowing it to be deformed as shown when piezo transducer 72 translates a distance laterally, causing the end of the heating element to now be at position p2. The elevated temperature of the metal wire causes it to become pliable such that it undergoes deformation when the heating element 84 at the end of piezo transducer 72 moves from position p1 to p2. Because of the presence of the high-pressure gas within the reaction area 78, the metal wire 12 is deformed towards the nozzle area 18, which is at lower (e.g., room) pressure. The movement of the heating element 84 causes it to come into contact with areas of wire 12 larger than its end cross section, aiding in the heating process.

Figure 13D:
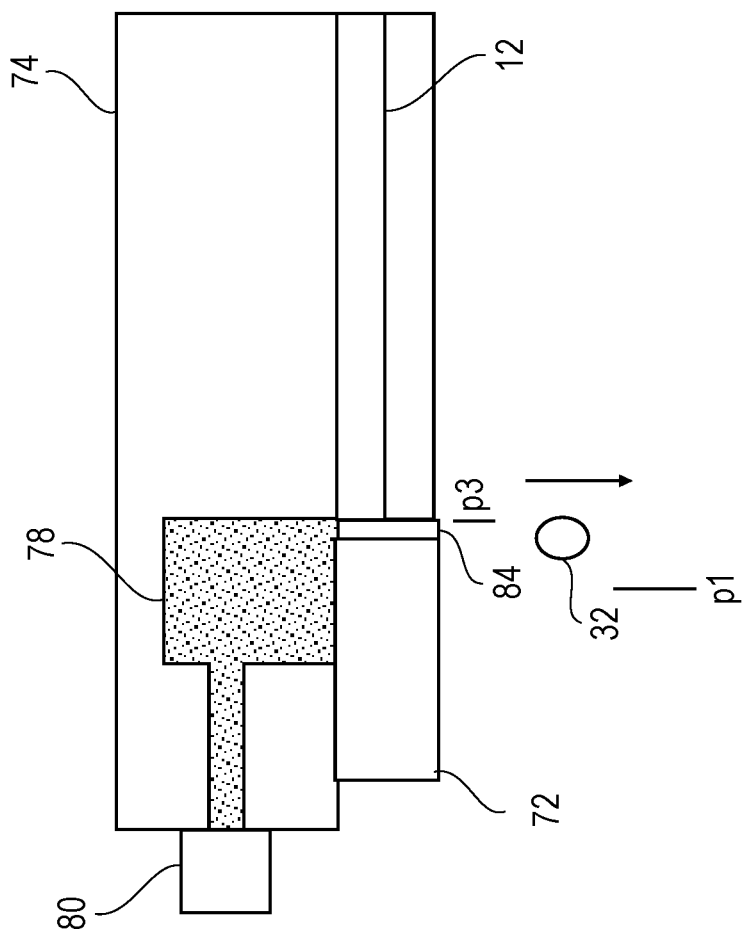
Figure 13D:
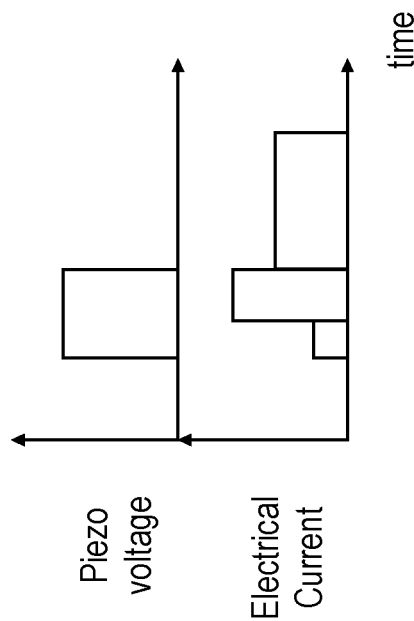
Figure 13E:
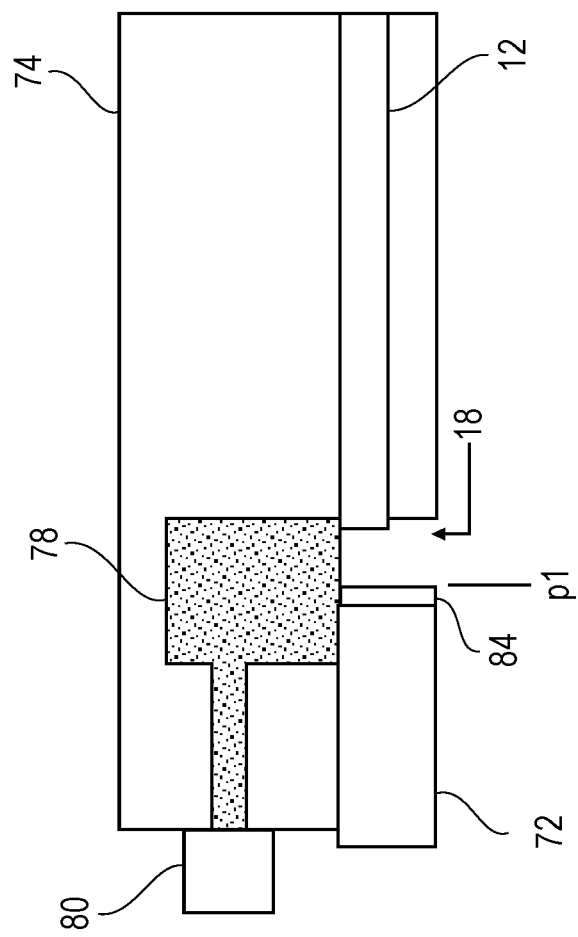
Figure 13E:
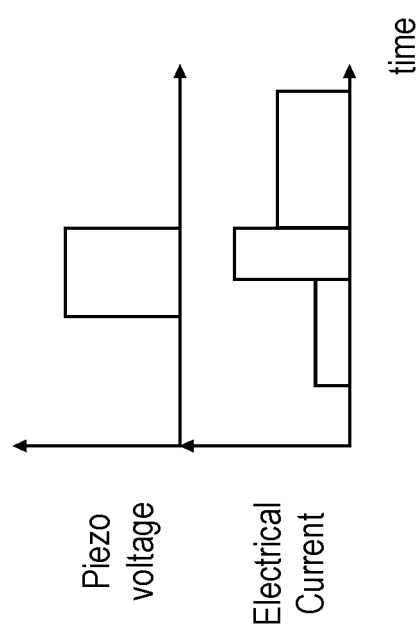

FIG. 13D shows the system a few moments later than at the time illustrated in FIG. 13C. The piezo transducer 72 has completed its translation so that the portion of the metal wire 12 that has become hot and pliable has formed a droplet 32 that has been detached from the remainder of metal wire 12 and jetted, under the influence of the high-pressure gas and/or gravity, towards the receiving substrate (not shown). When the piezo translator reaches the extent of its lateral movement, characterized by the heating element 84 now being at position p3 at or near the end of the nozzle area 18, the electric current to the piezo translator is turned off, causing the piezo translator to return to its original position, as shown in FIG. 13E. Also, the electrical current to heating element 84 is turned off. In some embodiments, the timing of the electrical pulses to the heating element 84 and the piezo translator 72 may be time-based, according to programs executed by timed by controller 30 (not shown here), and/or may be based on visual observations of the condition of metal wire 12 and the formation of droplets 32 as provided by one or more cameras (not shown).

Figure 13F:
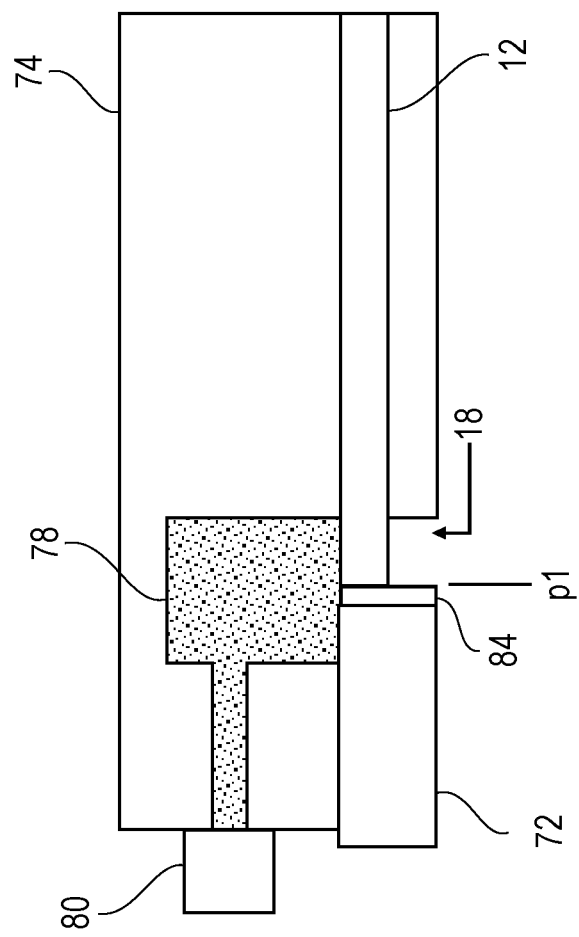
Figure 13F:
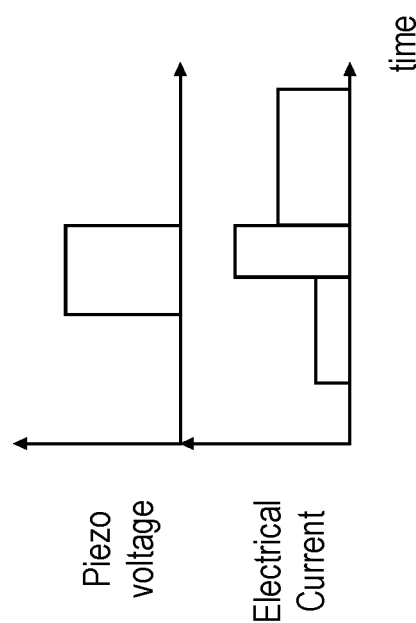

As illustrated in FIGS. 13E and 13F, when the piezo translator 72 and heating element 84 have returned to their original positions, the metal micro wire 12 is translated by piezo translator 20 (not shown here) so that the end of the wire is positioned abutting the heating element at p1. From this state of the system, the above-described process may be repeated to for a new metal droplet. Prior to doing so, the receiving substrate may be repositioned with respect to the nozzle area 18 so that the next droplet will be jetted to a desired position consistent with that required for formation of the object under construction.

Figure 14:
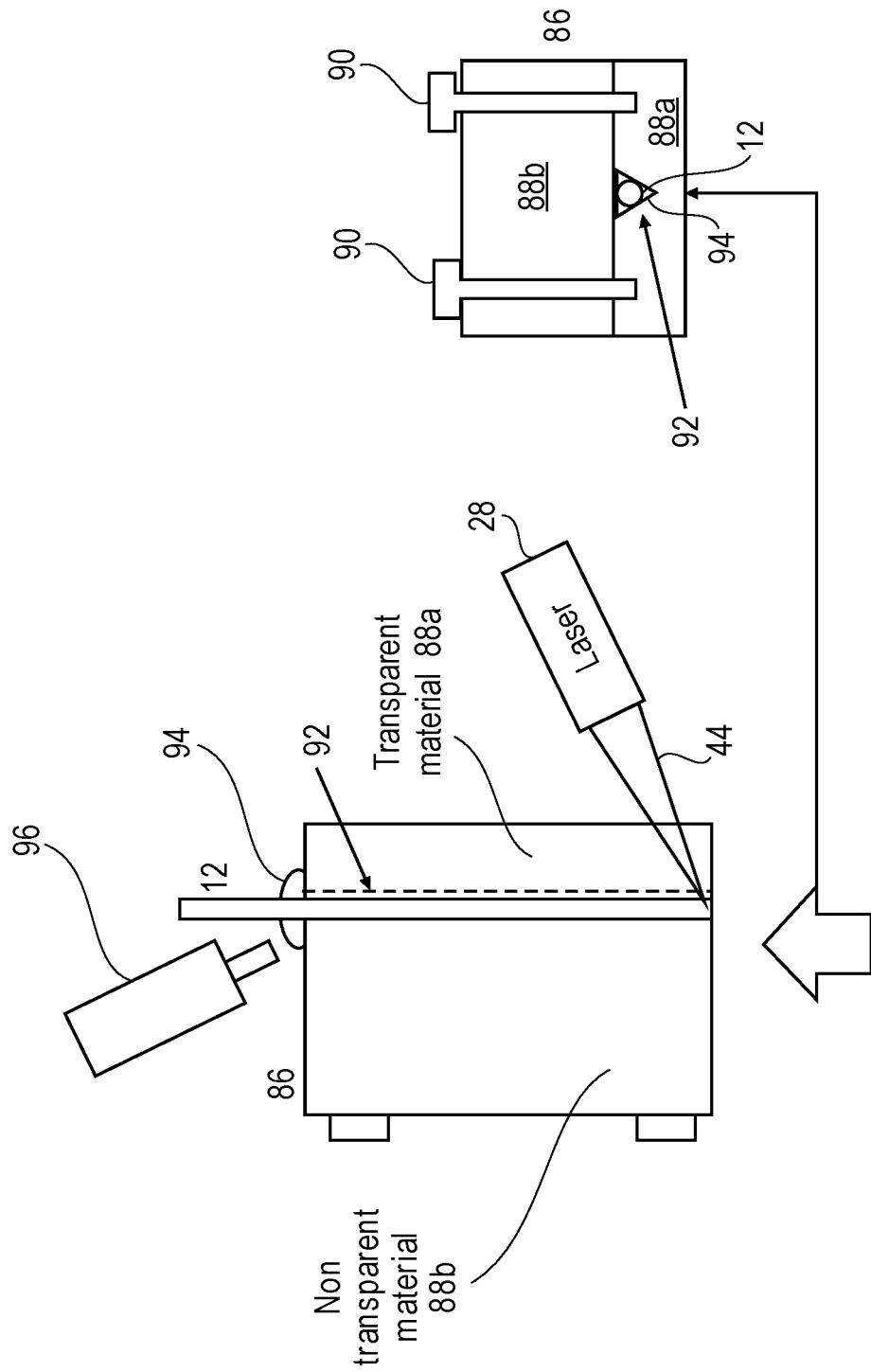
FIG. 14 illustrates a further example of a system embodying the present invention in which a metal micro wire is disposed within an arrangement configured to cause jetting of metal droplets.

Referring now to FIG. 14, a further example of a metal micro wire 12 disposed within an arrangement configured to cause jetting of metal droplets is illustrated. In this example, details of the apparatus relating to the feeding of the wire into the area at which laser irradiation is provided are not shown, but may be similar to any of those in the embodiments described above. Further, in this illustration the supporting arrangement 86 for micro wire 12 is shown as including a transparent (at the wavelength of the laser beam) portion 88a and a nontransparent portion 88b. In other embodiments, however, a transparent support 24, as described above, may be used. Where a two (or more) piece supporting structure 86 is used, the portions of the supporting structure may be held together using pins 90 (e.g., which may be threaded, or partially so, to allow for secure joining of the pieces.

As shown at right (which is a bottom view of the arrangement), the through hole 92 in this embodiment has a triangular shape. In one embodiment, this shape may be provided by notching a "v"-shaped channel along an edge of the transparent portion 88b of the support structure 86. When the two portions of the support structure are then combined, the smooth surface of the non-transparent portion 88b will provide one side to the triangular-shaped through hole, with the remaining two sides provided by the walls of the v-shaped groove in the transparent portion. Using a triangular-shaped through hole allows for the use of oil or grease to lubricate the meal micro wire as it passes into the supporting arrangement 86. This reduces friction and adhesion of the metal micro wire to the walls of the supporting arrangement, allowing the metal micro wire to pass more easily through the through hole than if no such lubricant were used. The lubricant may be applied near the entrance of the through hole along the path transited by the metal micro wire using an appropriate dispenser 96. The dispenser may operate under the control of the controller (not shown in this view) to dispense very small amounts of lubricant either as needed (e.g., which may be determined based on feedback from the piezo translator or other measurement instrument), or on a predetermined schedule, or both.

In embodiments of the invention, various metal micro wires, consisting of either or both pure metals and alloys, may be used. For example, wires made of any of Al, Au, Ag, Cu, W, or Ti, and/or alloys thereof, may be used.

Thus, methods and apparatus for additive manufacturing, and, in particular, to such methods and apparatus as employ pulsed lasers or other heating arrangements to create metal droplets from donor micro wires, which droplets, when solidified in the aggregate, form 3D structures, have been described.

What is claimed is:
1. A system for metal laser jetting comprising:
 a supply of metal micro wire arranged so as to be fed towards a nozzle area by a translator, the metal micro wire being supported along its length in a through hole of a glass substrate and the nozzle area being located at an exit of the through hole, wherein the translator is configured to position an end portion of the metal micro wire near the nozzle area; and
 a laser positioned to emit, under control of a controller, light pulses towards the nozzle area, thereby causing the end portion of the metal micro wire near the nozzle area to be heated, and wherein the controller is configured to cause the laser to briefly increase the energy of the light pulses from the laser during a time the light pulses are incident on the nozzle area to promote expulsion of metal droplets.

2. The system for metal laser jetting of claim 1, further comprising a receiving substrate positioned to receive the metal droplets jetted from the nozzle area.

3. The system for metal laser jetting of claim 1, wherein the supply of metal micro wire is organized in one or more spools of metal micro wires, each associated with its own respective translator and either (a) a single glass substrate shared by some or all of the spools of metal micro wires, or (b) a respective supporting glass substrate arrangement.

4. The system for metal laser jetting of claim 1, wherein the glass substrate comprises fused quartz, fused silica, or ceramic glass.

5. The system for metal laser jetting of claim 1, further comprising a heater affixed to one or more sides of the glass substrate to preheat the metal micro wire.

6. The system for metal laser jetting of claim 1, wherein the laser emits the light pulses in (a) infrared (IR) wavelengths at or about 1 μm-10 μm, or (b) ultraviolet (UV) wavelengths, and the glass substrate is transparent, or nearly so, at a wavelength of the laser light pulses.

7. The system for metal laser jetting of claim 1, wherein the translator includes one or more piezo ceramics arranged to move the micro wire in a defined direction upon application of an electric current under the control of the controller.

8. The system for metal laser jetting of claim 1, wherein the supply of metal micro wire is organized in multiple spools of metal micro wires and the laser is included in a scanning laser arrangement configured to scan, under the control of the controller, a single laser beam over a scanning path so that the laser beam, when activated, is incident upon one of a plurality of nozzle areas associated with a respective one of the metal micro wires.

9. The system for metal laser jetting of claim 1, wherein the glass substrate defines a reaction area in which the metal micro wire is exposed to the light pulses, said reaction area including a second translator adjacent the nozzle area and further including a gas inlet.

10. A method of forming a three-dimensional (3D) article by fusion of metal droplets in forms defined by cross-sections of the article under construction in which successive layers of metal droplets are distributed over a receiving medium and previously deposited layers of metal droplets by depositing the droplets while moving the receiving medium relative to a nozzle area of a metal laser jetting system, said moving occurring between successive ones of the droplets, and a supply of metal micro wire is fed towards the nozzle area at which an end portion of the metal micro wire is heated by a laser pulse emitted from a laser under control of a controller and incident towards the nozzle area thereby causing the end portion of the metal micro wire near the nozzle area to form the droplets, said method characterized by energy of the laser pulses from the laser being briefly increased during a time the laser pulses are incident on the nozzle area to promote expulsion of metal droplets to form layers of metal on the receiving medium and, successively, on previously jetted layers.

11. The method of claim 10, wherein the controller causes the laser to emit the pulses, thereby creating the metal droplets, at times corresponding to necessary applications of metal for forming the cross-sections of the article under construction according to provided images of the cross-sections and ensuring that the metal droplets are jetted when a portion of the receiving medium is positioned below the nozzle area at a point for which solid material is needed.

12. The method of claim 11, wherein after each droplet is jetted, the controller causes a translator to advance a quantity of the metal micro wire into the nozzle area in preparation for a next laser pulse.

13. The method of claim 12, wherein at or about the same time as causing the translator to advance the quantity of the metal micro wire into the nozzle area, the controller causes the receiving medium to be displaced relative to the nozzle area to a next position at which a metal droplet is to be jetted.

14. The method of claim 10, further comprising imaging the article under construction during its construction using an imaging device; evaluating images of the deposited layers of metal droplets as they are being formed; and controlling laser pulses incident on the metal micro wire in accordance said evaluation.

15. The method of claim 10, further comprising imaging the article under construction during its construction using an imaging device; and modifying an image of a cross-sectional layer of the article under construction used to produce the article under construction according to feedback provided by the imaging device so that one or more areas of the image are adjusted from those associated with an original version of said image.

* * * * *